United States Patent
Hopkins et al.

(10) Patent No.: US 11,715,692 B2
(45) Date of Patent: Aug. 1, 2023

(54) MICROELECTRONIC DEVICES INCLUDING CONDUCTIVE RAILS, AND RELATED METHODS

(71) Applicant: Micron Technology, Inc., Boise, ID (US)

(72) Inventors: John D. Hopkins, Meridian, ID (US); Jordan D. Greenlee, Boise, ID (US); Francois H. Fabreguette, Boise, ID (US); John A. Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 96 days.

(21) Appl. No.: 16/990,580

(22) Filed: Aug. 11, 2020

(65) Prior Publication Data

US 2022/0051980 A1 Feb. 17, 2022

(51) Int. Cl.
*H01L 23/528* (2006.01)
*H01L 23/522* (2006.01)
(Continued)

(52) U.S. Cl.
CPC .... *H01L 23/5286* (2013.01); *H01L 21/76831* (2013.01); *H01L 21/76843* (2013.01);
(Continued)

(58) Field of Classification Search
CPC ............. H01L 27/0688; H01L 45/1233; H01L 45/146; H01L 27/2409; H01L 27/1021
See application file for complete search history.

(56) References Cited

U.S. PATENT DOCUMENTS

| 4,641,417 A | 2/1987 | McDavid |
| 5,780,919 A | 7/1998 | Chua et al. |

(Continued)

FOREIGN PATENT DOCUMENTS

| CN | 111785728 A | 10/2020 |
| KR | 10-2004-0051189 A | 6/2004 |

(Continued)

OTHER PUBLICATIONS

Hopkins et al., U.S. Appl. No. 16/539,700 titled Three-Dimensional Memory with Conductive Rails in Conductive Tiers, and Related Apparatus, Systems and Methods filed Aug. 13, 2019.
(Continued)

*Primary Examiner* — Tony Tran
(74) *Attorney, Agent, or Firm* — TraskBritt

(57) ABSTRACT

A microelectronic device comprises a stack structure comprising alternating conductive structures and insulative structures arranged in tiers, each of the tiers individually comprising a conductive structure and an insulative structure, strings of memory cells vertically extending through the stack structure, the strings of memory cells comprising a channel material vertically extending through the stack structure, and conductive rails laterally adjacent to the conductive structures of the stack structure. The conductive rails comprise a material composition that is different than a material composition of the conductive structures of the stack structure. Related memory devices, electronic systems, and methods are also described.

16 Claims, 13 Drawing Sheets

(51) Int. Cl.
    *H01L 21/768* (2006.01)
    *H01L 23/535* (2006.01)
    *H01L 23/532* (2006.01)
    *H10B 41/27* (2023.01)
    *H10B 41/35* (2023.01)
    *H10B 43/27* (2023.01)
    *H10B 43/35* (2023.01)

(52) U.S. Cl.
    CPC .. *H01L 21/76877* (2013.01); *H01L 21/76895* (2013.01); *H01L 23/5226* (2013.01); *H01L 23/5283* (2013.01); *H01L 23/535* (2013.01); *H01L 23/53266* (2013.01); *H10B 41/27* (2023.02); *H10B 41/35* (2023.02); *H10B 43/27* (2023.02); *H10B 43/35* (2023.02)

(56) References Cited

U.S. PATENT DOCUMENTS

| | | |
|---|---|---|
| 6,636,415 B2 | 10/2003 | Tang et al. |
| 7,830,016 B2 | 11/2010 | Meldrim et al. |
| 8,546,239 B2 | 10/2013 | Harari et al. |
| 8,599,616 B2 | 12/2013 | Roizin et al. |
| 8,778,749 B2 | 7/2014 | Pachamuthu et al. |
| 9,159,739 B2 * | 10/2015 | Makala ............. H01L 27/11556 |
| 9,177,853 B1 | 11/2015 | Futase et al. |
| 9,337,203 B2 | 5/2016 | Hwang et al. |
| 9,425,200 B2 | 8/2016 | Hwang et al. |
| 9,460,958 B2 | 10/2016 | Purayath et al. |
| 9,524,779 B2 | 12/2016 | Kai et al. |
| 9,524,904 B2 | 12/2016 | Ohori et al. |
| 9,698,149 B2 | 7/2017 | Purayath et al. |
| 9,786,598 B2 | 10/2017 | Kim et al. |
| 10,115,459 B1 | 10/2018 | Yamada et al. |
| 10,236,047 B1 | 3/2019 | Ryan et al. |
| 10,418,354 B2 | 9/2019 | Ryu et al. |
| 10,566,333 B2 | 2/2020 | Lee et al. |
| 10,734,400 B1 | 8/2020 | Fukuo et al. |
| 2007/0218318 A1 | 9/2007 | Watanabe |
| 2009/0142925 A1 | 6/2009 | Ha et al. |
| 2011/0248252 A1 | 10/2011 | Ohnishi et al. |
| 2012/0058639 A1 | 3/2012 | Sim et al. |
| 2013/0168757 A1 | 7/2013 | Hong |
| 2013/0228934 A1 | 9/2013 | Kim et al. |
| 2013/0320050 A1 | 12/2013 | Elliott |
| 2014/0159135 A1 | 6/2014 | Fujimoto et al. |
| 2014/0175659 A1 | 6/2014 | Lee et al. |
| 2014/0231908 A1 | 8/2014 | Chen et al. |
| 2015/0076708 A1 | 3/2015 | Kaneko et al. |
| 2015/0228531 A1 | 8/2015 | Tagami |
| 2015/0243708 A1 | 8/2015 | Ravasio et al. |
| 2016/0093635 A1 | 3/2016 | Rabkin et al. |
| 2016/0141337 A1 | 5/2016 | Shimabukuro et al. |
| 2016/0247783 A1 | 8/2016 | Minami et al. |
| 2016/0276273 A1 | 9/2016 | Kwon et al. |
| 2016/0276282 A1 | 9/2016 | Masayoshi |
| 2017/0040207 A1 | 2/2017 | Purayath et al. |
| 2017/0076974 A1 | 3/2017 | Choi et al. |
| 2017/0148811 A1 | 5/2017 | Zhang et al. |
| 2017/0256485 A1 | 9/2017 | Tagami |
| 2017/0256551 A1 | 9/2017 | Lee |
| 2019/0035733 A1 | 1/2019 | Park |
| 2019/0043876 A1 | 2/2019 | Van Schravendijk et al. |
| 2019/0081049 A1 | 3/2019 | Zang |
| 2019/0273120 A1 | 9/2019 | Simsek-Ege et al. |
| 2020/0051993 A1 | 2/2020 | Rabkin et al. |
| 2020/0176451 A1 | 6/2020 | Kang et al. |
| 2020/0303308 A1 | 9/2020 | Kitamura et al. |
| 2021/0193585 A1 | 6/2021 | Said et al. |

FOREIGN PATENT DOCUMENTS

| | | |
|---|---|---|
| WO | 2017/052494 A1 | 3/2017 |
| WO | 2019/036292 A1 | 2/2019 |

OTHER PUBLICATIONS

Jain et al., U.S. Appl. No. 16/743,329 title Memory Arrays and Methods Used in Forming a Memory Array filed Jan. 15, 2020.

Kaushik et al., U.S. Appl. No. 16/924,506 titled Integrated Assemblies Having Conductive-Shield-Structures Between Linear-Conductive-Structures, filed Jul. 9, 2020.

Machine Translation of CN111785728, originaly published on Oct. 16, 2020.

Mackus et al., From the Bottom-Up: Toward Area-Selective Atomic Layer Deposition with High Selectivity, Chemistry of Materials, vol. 31, (2019), pp. 2-12.

Vahdat et al., U.S. Appl. No. 16/793,263 titled Memory Arrays and methods Used in Forming a Memory Array filed Feb. 18, 2020.

* cited by examiner

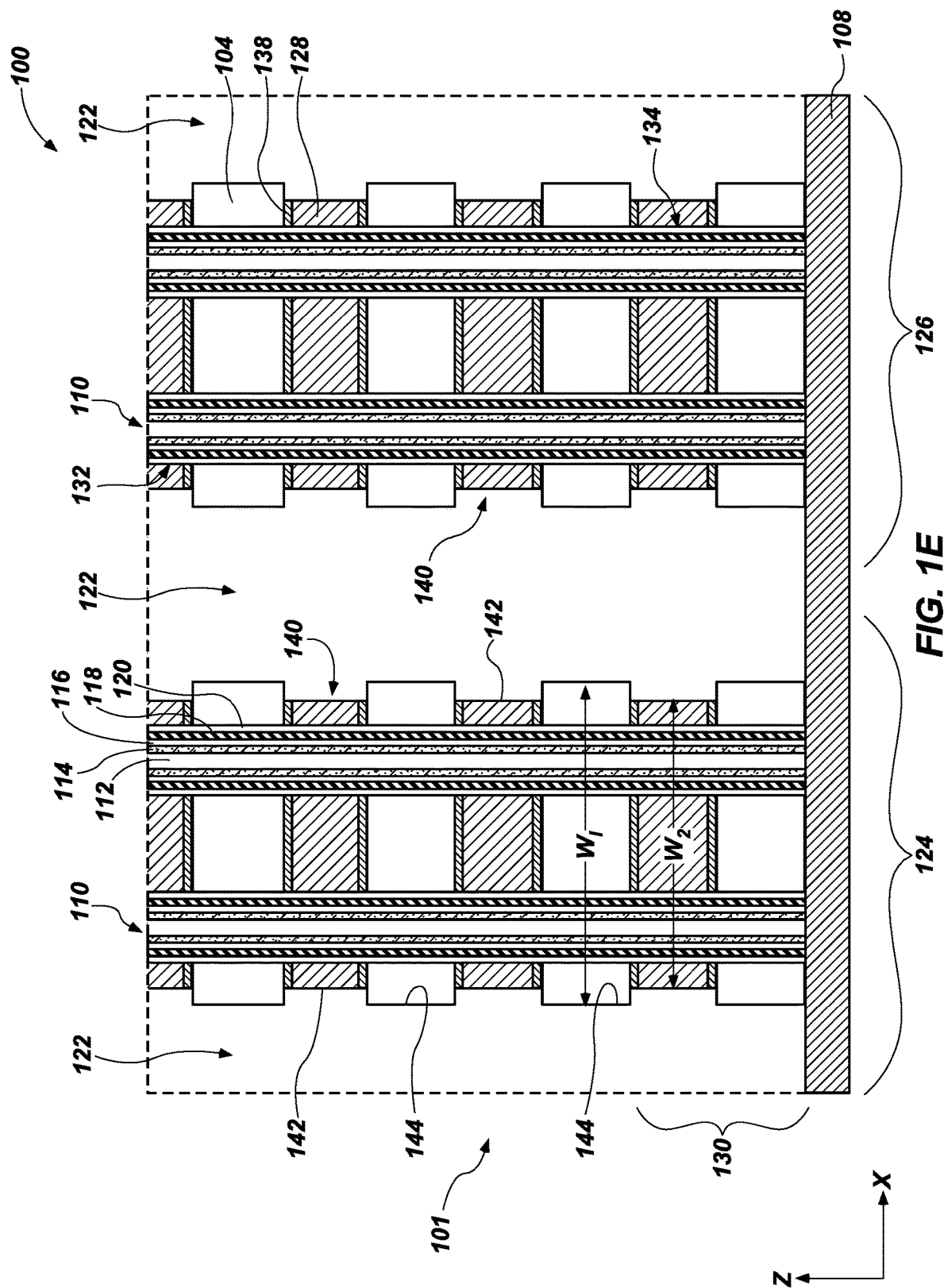

US 11,715,692 B2

MICROELECTRONIC DEVICES INCLUDING CONDUCTIVE RAILS, AND RELATED METHODS

TECHNICAL FIELD

The disclosure, in various embodiments, relates generally to the field of microelectronic device design and fabrication. More specifically, the disclosure relates to microelectronic devices and apparatuses including conductive rails adjacent to conductive structures in conductive tiers, and to related memory devices, electronic systems, and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more conductive stack structures including tiers of conductive structures and insulative structures. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the conductive stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the conductive stack structure(s) of the memory device. The staircase structure includes individual "steps" defining contact regions of the conductive structures, upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the number of tiers of the conductive structures increases, processing conditions for the formation of the vertical memory strings extending through the stack becomes increasingly difficult. In addition, as the thickness of each tier decreases to increase the number of tiers within a given height of the stack, the resistivity of the conductive structures may increase and the conductivity may exhibit a corresponding decrease. However, a reduction in the conductivity of the conductive structures may impact performance of the stings of memory cells.

BRIEF DESCRIPTION OF THE DRAWINGS

FIG. 1A through FIG. 1J are simplified cross-sectional views illustrating a method of forming a microelectronic device, in accordance with embodiments of the disclosure;

DETAILED DESCRIPTION

Figure 1A:
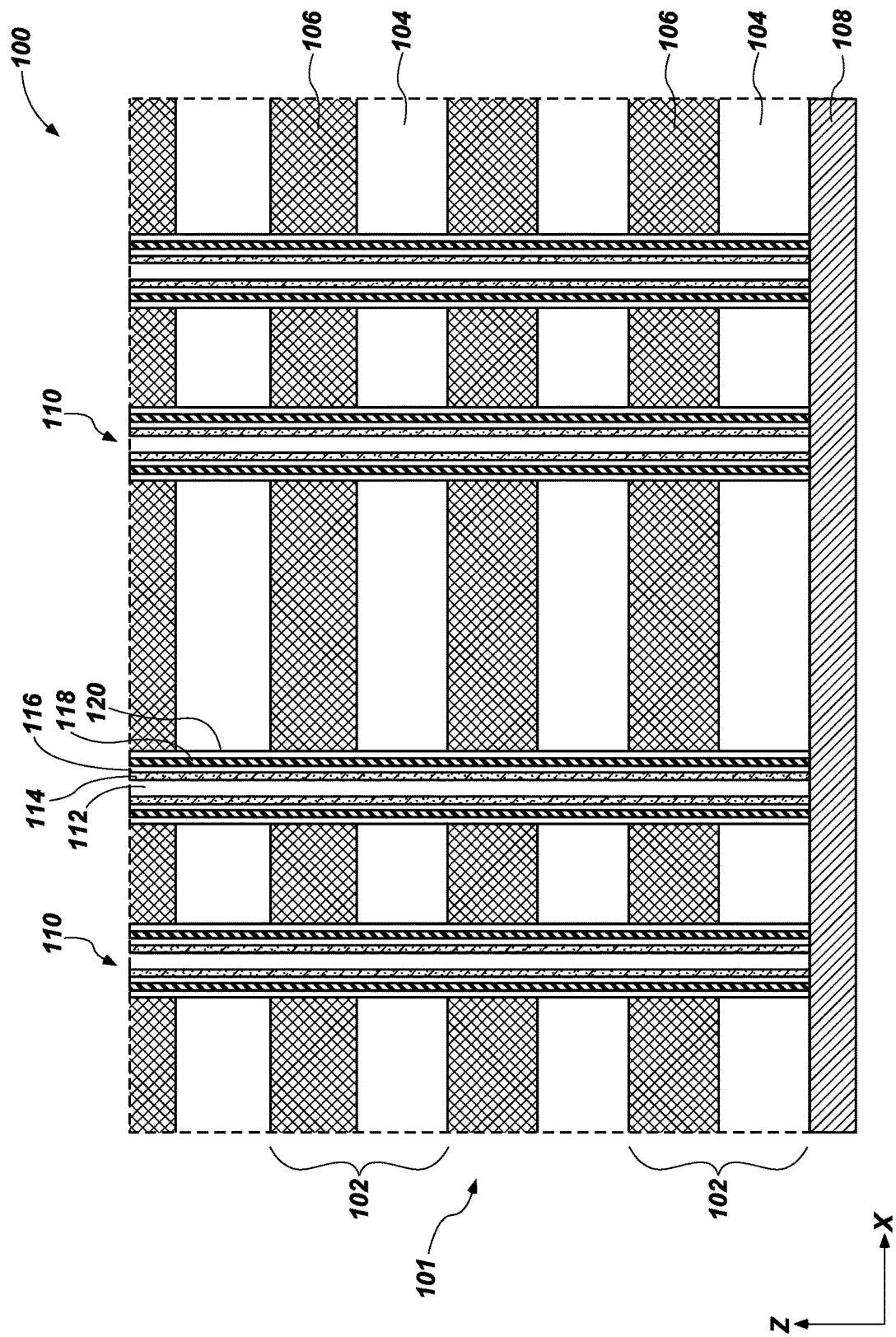

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the claims. The drawings are not necessarily to scale. Additionally, elements common between figures may retain the same numerical designation.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "pitch" refers to a distance between identical points in two adjacent (i.e., neighboring) features.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

Unless otherwise specified, materials described herein may be formed by conventional techniques including, but not limited to, spin coating, blanket coating (e.g., spray coating), chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, atomic layer removal processes, abrasive planarization (e.g., chemical-mechanical planarization), or other known methods unless the context indicates otherwise.

Figure 1B:
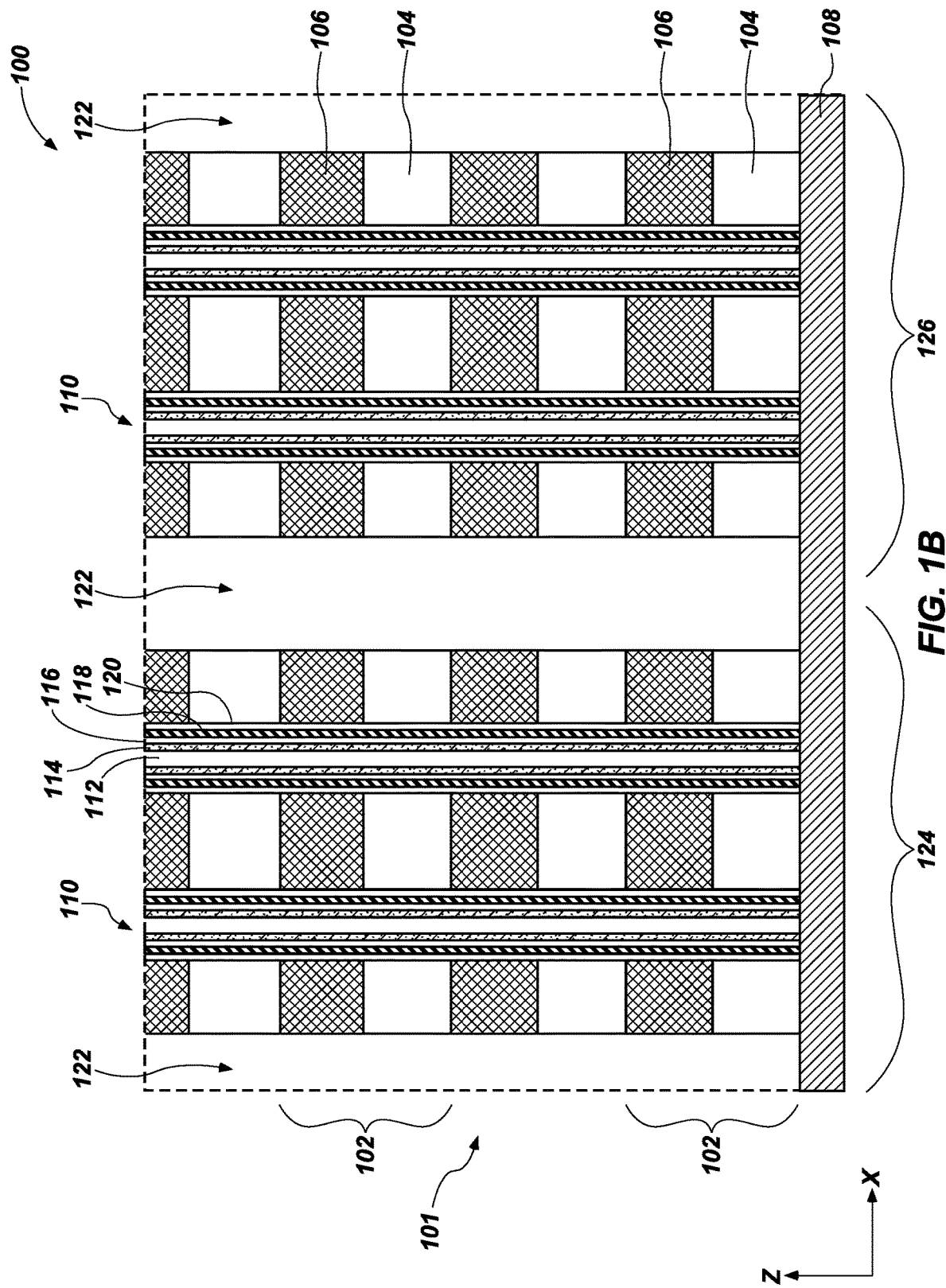
Figure 1C:
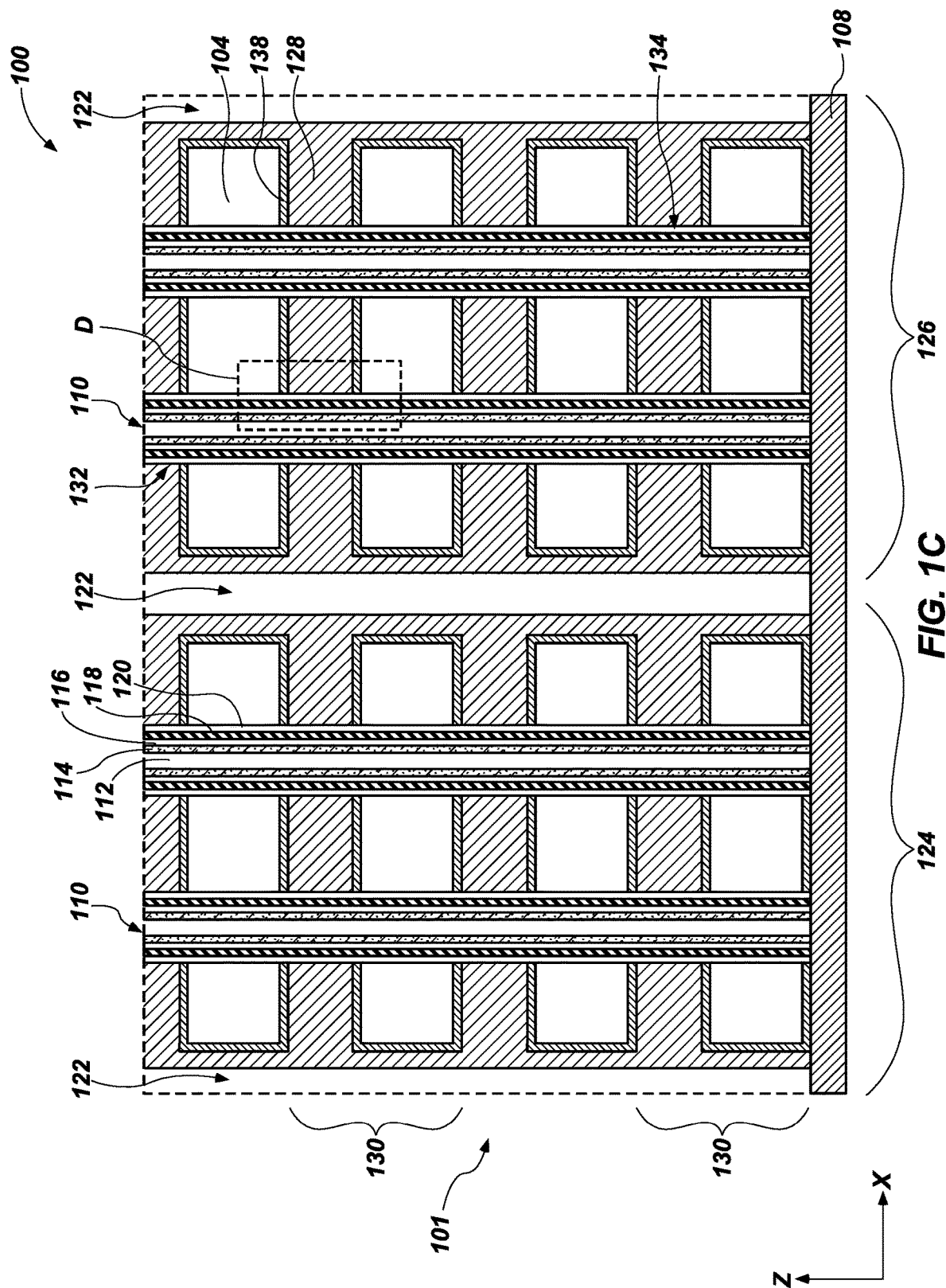
Figure 1D:
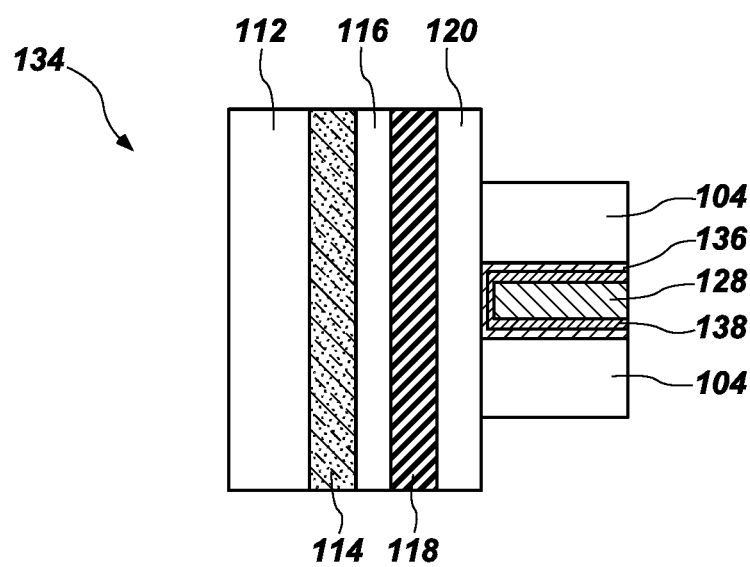
Figure 1F:
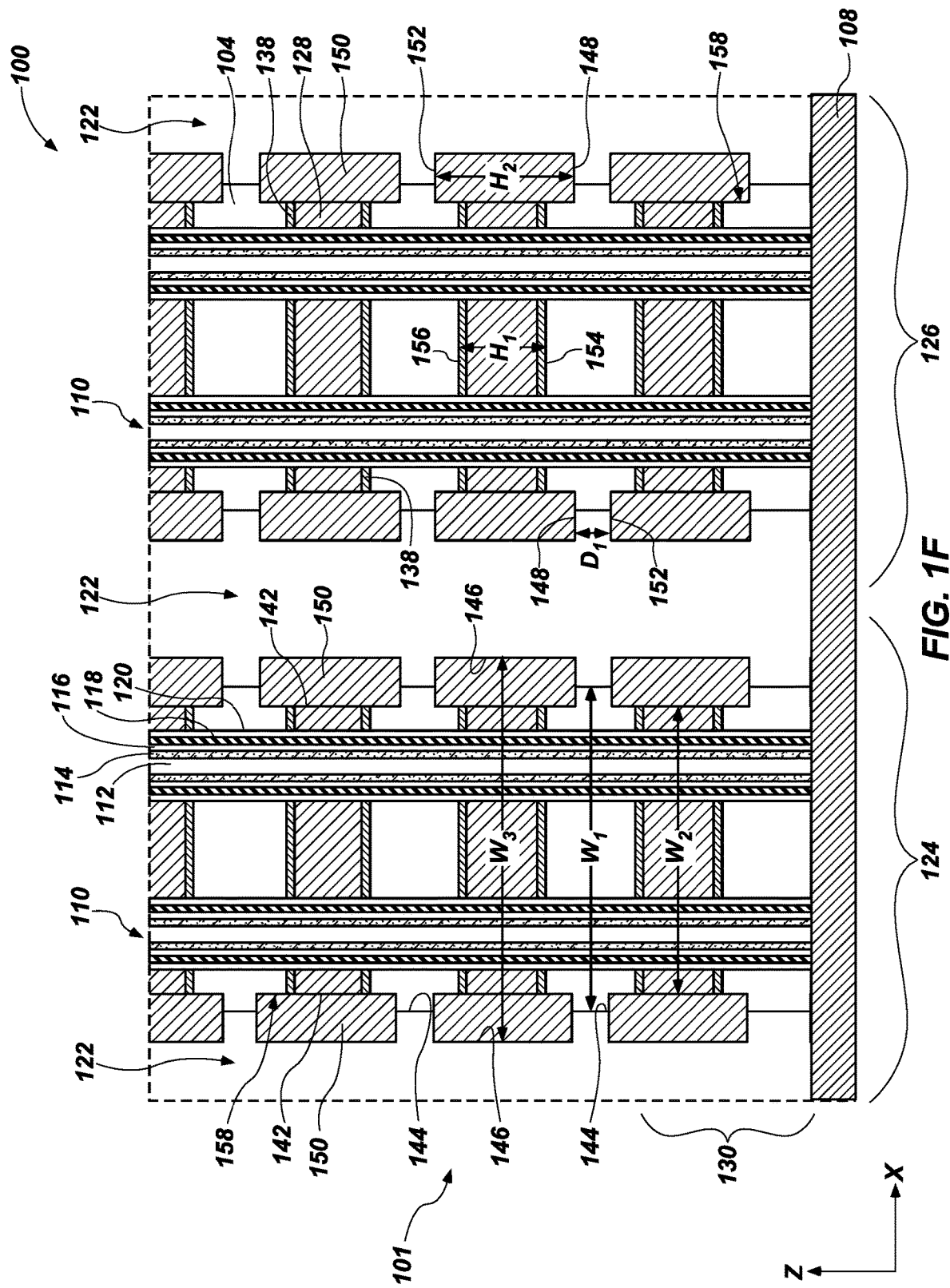
Figure 1G:
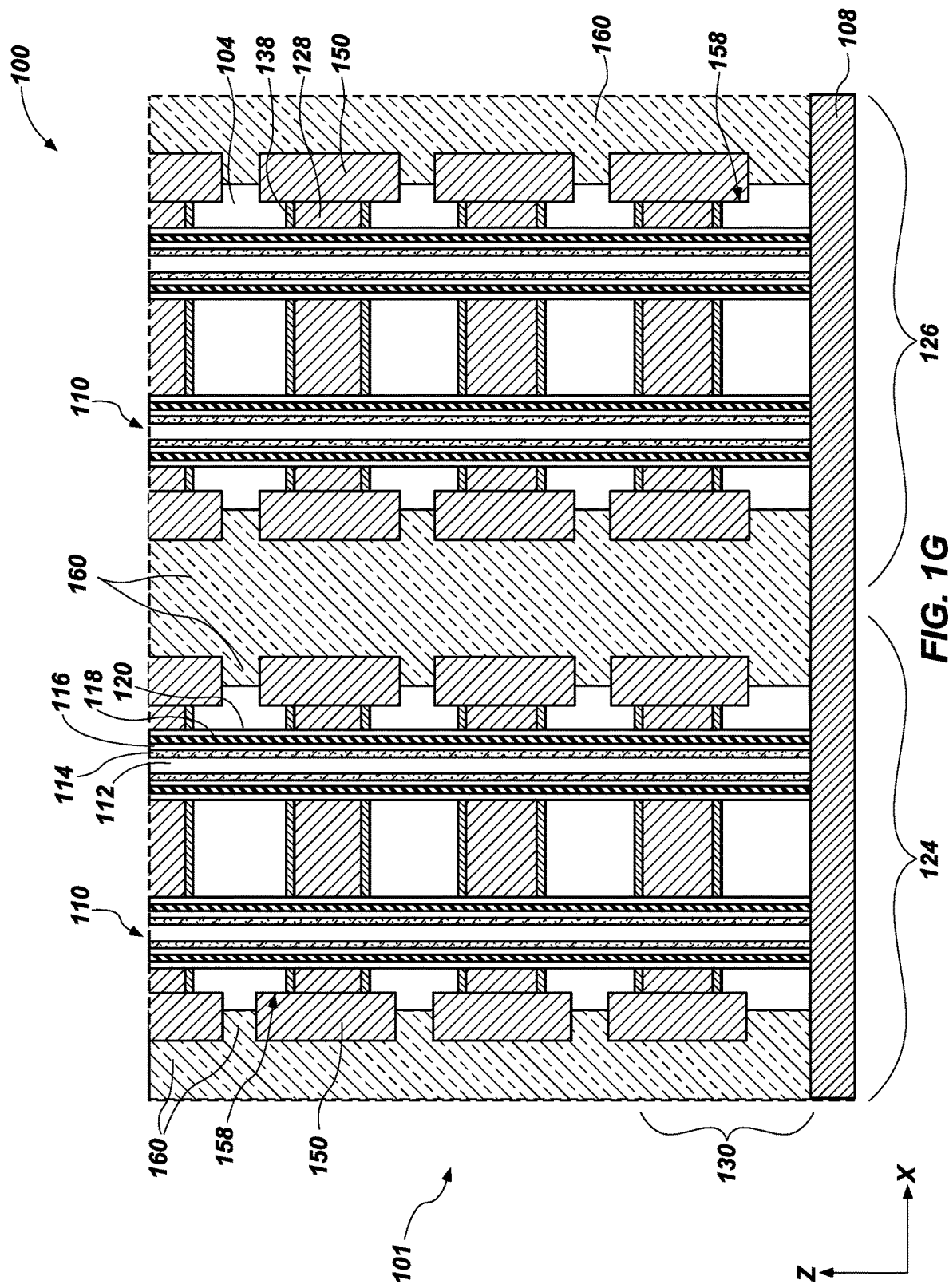
Figure 1H:
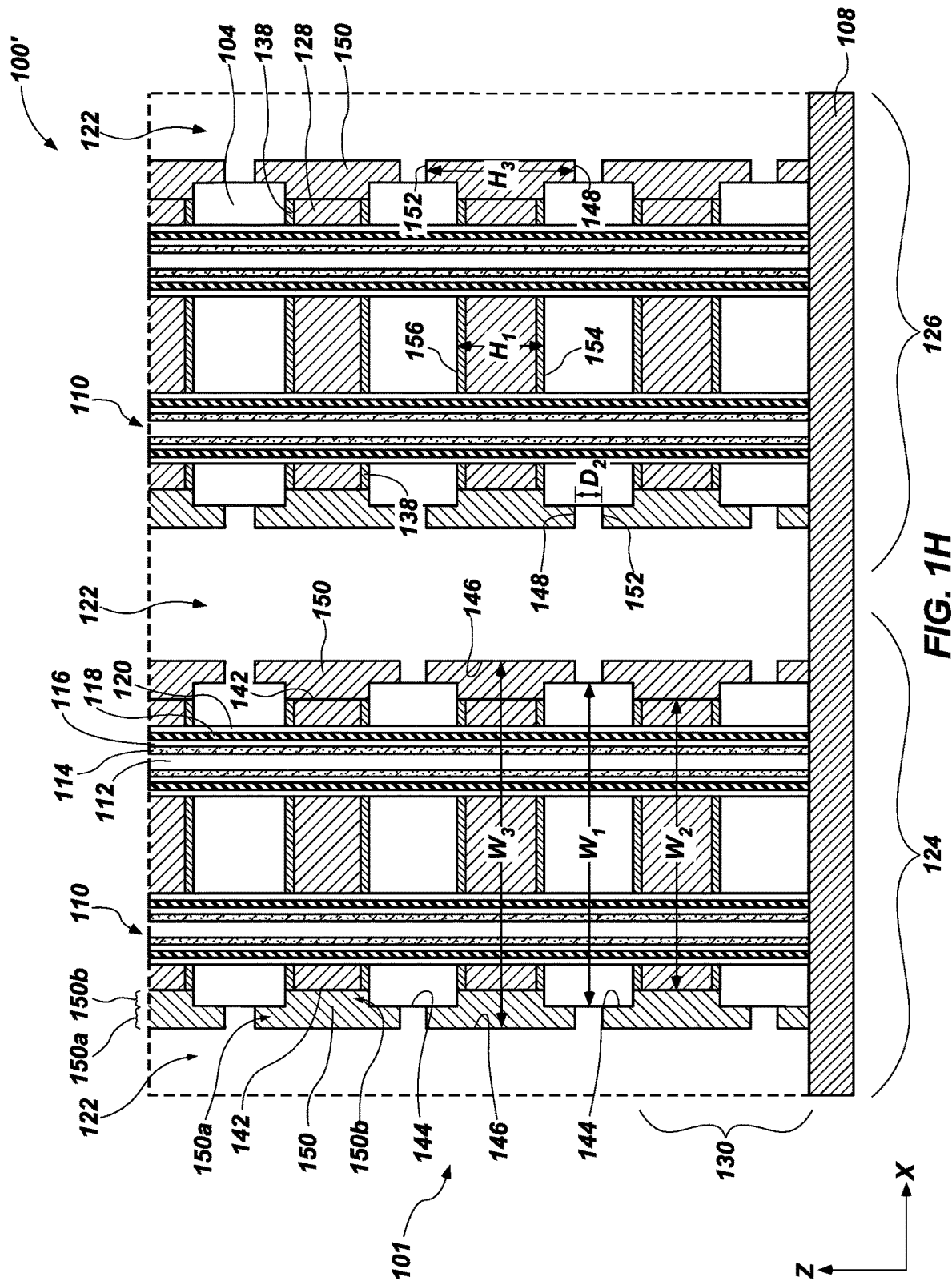
Figure 1I:
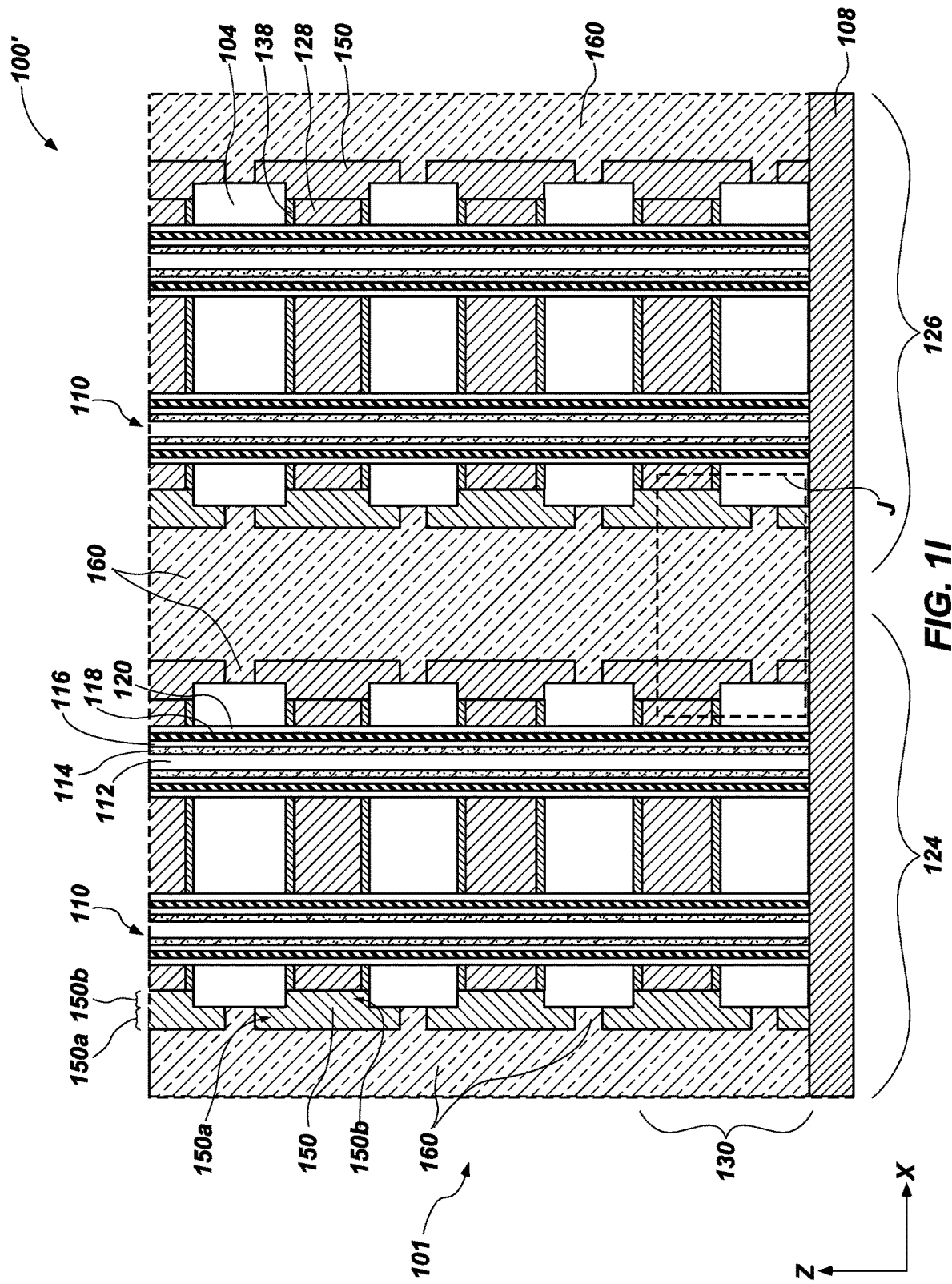
Figure 1J:
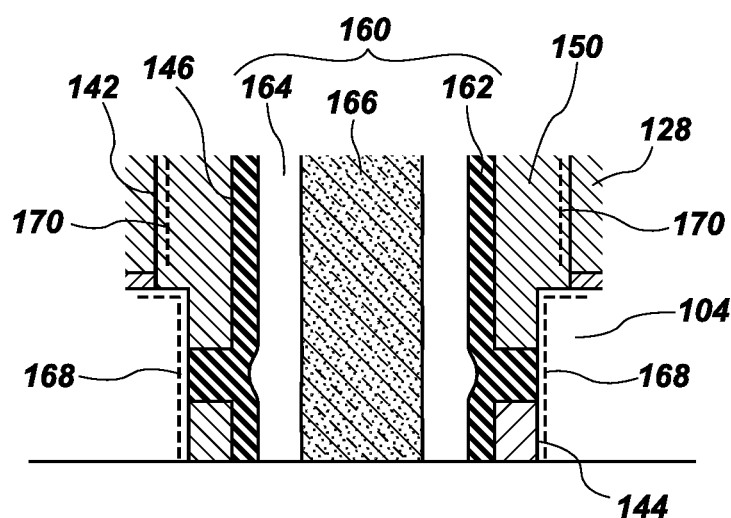

FIG. 1A through FIG. 1J illustrate a method of forming a microelectronic device structure for a microelectronic device (e.g., a memory device, such as a 3D NAND Flash memory device), in accordance with embodiments of the disclosure, of which FIGS. 1D and 1J are enlarged portions of FIGS. 1C and 1I, respectively. Referring to FIG. 1A a microelectronic device structure 100 may be formed to include a stack structure 101 including a vertically (e.g., in the Z-direction) alternating sequence of insulative structures 104 and other insulative structures 106 arranged in tiers 102. Each of the tiers 102 may individually include at least one of the insulative structures 104 directly vertically adjacent at least one of the other insulative structures 106.

In some embodiments, a number (e.g., quantity) of tiers 102 of the stack structure 101 is within a range from 32 of the tiers 102 to 256 of the tiers 102. In some embodiments, the stack structure 101 includes 128 of the tiers 102. However, the disclosure is not so limited, and the stack structure 101 may include a different number of the tiers 102. The stack structure 101 may comprise at least one (e.g., one, two, more than two) deck structure vertically overlying a source structure 108. For example, the stack structure 101 may comprise a single deck structure or a dual deck structure for a 3D memory device (e.g., a 3D NAND Flash memory device).

The insulative structures 104 may be formed of and include, for example, at least one dielectric material, such as at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$). In some embodiments, the insulative structures 104 are formed of and include $SiO_2$.

The other insulative structures 106 may be formed of and include an insulative material that is different than, and exhibits an etch selectivity with respect to, the insulative structures 104. In some embodiments, the other insulative structures 106 are formed of and include at least one dielectric nitride material (e.g., $SiN_y$) or at least one oxynitride material (e.g., $SiO_xN_y$). In some embodiments, the other insulative structures 106 comprise $Si_3N_4$.

The stack structure 101 may be formed on or over the source structure 108 (e.g., a source plate). The source structure 108 may be formed of and include a conductive material such as, for example, a semiconductor material (e.g., polysilicon) doped with at least one P-type dopant (e.g., one or more of boron, aluminum, and gallium) or at least one N-type dopant (e.g., arsenic, phosphorous, antimony).

With continued reference to FIG. 1A, pillars 110 of materials may be formed to vertically extend (e.g., in the Z-direction) through the stack structure 101. As will be described herein, the materials of the pillars 110 may be employed to form memory cells for a memory device following subsequent processing of the microelectronic device structure. The pillars 110 may each individually comprise an insulative material 112, a channel material 114 horizontally adjacent to the insulative material 112, a tunnel dielectric material (also referred to as a "tunneling dielectric material") 116 horizontally adjacent to the channel material 114, a memory material 118 horizontally adjacent to the tunnel dielectric material 116, and a dielectric blocking material (also referred to as a "charge blocking material") 120 horizontally adjacent to the memory material 118. The dielectric blocking material 120 may be horizontally adjacent to one of the levels of other insulative structures 106 of one of the tiers 102 of the stack structure 101. The channel material 114 may be horizontally interposed between the insulative material 112 and the tunnel dielectric material 116; the tunnel dielectric material 116 may be horizontally interposed between the channel material 114 and the memory material 118; the memory material 118 may be horizontally interposed between the tunnel dielectric material 116 and the dielectric blocking material 120; and the dielectric blocking material 120 may be horizontally interposed between the memory material 118 and a level of the other insulative structure 106.

The insulative material 112 may be formed of and include at least one insulative material. In some embodiments, the insulative material 112 is formed of and includes a dielectric oxide material, such as $SiO_2$. In additional embodiments, the insulative material 112 comprises an air gap.

The channel material 114 may be formed of and include one or more of at least one semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and at least one oxide semiconductor material. In some embodiments, the channel material 114 includes amorphous silicon or polycrystalline silicon. In some embodiments, the channel material 114 comprises a doped semiconductor material.

The tunnel dielectric material 116 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 116 may be formed of and include one or more of a dielectric oxide material, a dielectric nitride material, and a dielectric oxynitride material. In some embodiments, the tunnel dielectric material 116 comprises Sift. In other embodiments, the tunnel dielectric material 116 comprises $SiO_xN_y$.

The memory material 118 may comprise a charge trapping material or a conductive material. By way of non-limiting example, the memory material 118 may be formed of and include one or more of silicon nitride, silicon oxynitride, polysilicon (doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), and a semiconductive material (e.g., a polycrystalline semiconductive material, an amorphous semiconductor material). In some embodiments, the memory material 118 comprises $Si_3N_4$.

The dielectric blocking material 120 may be formed of and include a dielectric material such as, for example, one or more of a dielectric oxide (e.g., $SiO_x$), a dielectric nitride (e.g., $SiN_y$), and a dielectric oxynitride (e.g., $SiO_xN_y$), or another dielectric material. In some embodiments, the dielectric blocking material 120 comprises $SiO_xN_y$.

In some embodiments the tunnel dielectric material 116, the memory material 118, and the dielectric blocking material 120 together may comprise a structure configured to trap a charge, such as, for example, an oxide-nitride-oxide (ONO) structure. In some such embodiments, the tunnel dielectric material 116 comprises $SiO_2$, the memory material 118 comprises $Si_3N_4$, and the dielectric blocking material 120 comprises $SiO_2$.

Referring to FIG. 1B, slots 122, which may also be referred to as "slits" or "replacement gate slots" may be formed through the stack structure 101. In some embodiments, the slots 122 are formed to vertically extend completely through the stack structure 101 and expose portions of the source structure 108. The slots 122 may be formed by, for example, exposing the microelectronic device structure 100 to one or more etchants to remove portions of the insulative structures 104 and the other insulative structures 106 of the stack structure 101. The slots 122 may divide the microelectronic device structure 100 into separate blocks, such as a first block 124 and a second block 126. As shown in FIG. 1B, the first block 124 and the second block 126 may each include a plurality (e.g., multiple, more than one) of the pillars 110.

With reference to FIG. 1C, after forming the slots 122, the other insulative structures 106 (FIG. 1B) of the stack structure 101 may be at least partially (e.g., substantially) removed through the slots 122 through a so-called "replacement gate" or "gate last" process. By way of non-limiting example, the other insulative structures 106 may be at least partially removed by exposing the other insulative structures 106 to at least one wet etchant comprising one or more of phosphoric acid, sulfuric acid, hydrochloric acid, nitric acid, or another material. In some embodiments, the other insulative structures 106 are at least partially removed by exposing the other insulative structures 106 to a so-called "wet nitride strip" comprising a wet etchant comprising phosphoric acid.

As shown in FIG. 1C, after removal of the other insulative structures 106, conductive structures 128 may be formed between vertically neighboring insulative structures 104 at locations corresponding to the locations of the other insulative structures 106 (FIG. 1B) to form tiers 130 the insulative structures 104 and the conductive structures 128, and strings 132 of memory cells 134 vertically extending through the stack structure 101.

In some embodiments, the conductive structures 128 are employed as comprise word lines (e.g., local word lines) for the strings 132 of memory cells 134. In addition, conductive structures 128 of one or more (e.g., from one to five) vertically lower tiers 130 (e.g., a vertically lowest tier 130) may be employed as select gate structures (e.g., select gate source (SGS) structures). Furthermore, conductive structures 128 of one or more (e.g., from one to five) vertically upper tiers 130 (e.g., a vertically highest tier 130) may be employed as select gate structures (e.g., select gate drain (SGD) structures).

The conductive structures 128 may be formed of and include a conductive material, such as, for example, one or more of tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including one or more of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively doped silicon, conductively doped germanium, conductively doped silicon germanium), polysilicon, and other materials exhibiting electrical conductivity. In some embodiments, the conductive structures 128 comprise a material including one or more of titanium, ruthenium, aluminum, and molybdenum, while being substantially devoid (e.g., substantially absent) of tungsten. In some such embodiments, the conductive structures 128 may include at least some atoms of a precursor material (e.g., chlorine, carbon, oxygen) employed to from the conductive structures 128.

Intersections of the conductive structures 128 and the pillars 110 may form individual memory cells 134 of the strings 132 of the memory cells 134. FIG. 1D illustrates an enlarged portion of box D of FIG. 1C and illustrates a memory cell 134, in accordance with embodiments of the disclosure. With reference to FIG. 1D, the memory cells 134 may each include the channel material 114, the tunnel dielectric material 116 horizontally neighboring the channel material 114, the memory material 118 horizontally neighboring the tunnel dielectric material, the dielectric blocking material 120, and the conductive structures 128 horizontally neighboring the dielectric blocking material 120. In further embodiments, the memory cells 134 comprise so-called "floating gate" memory cells including floating gates (e.g., metallic floating gates) as charge storage structures. The floating gates may horizontally intervene between central structures of the pillars 110 and the conductive structures 128 of the tiers 130 of the stack structure 101.

In some embodiments, and as illustrated in FIG. 1D, a dielectric barrier material 136 may be formed directly neighboring the dielectric blocking material 120 and directly neighboring the insulative structures 104. A conductive liner material 138 may directly neighbor the dielectric barrier material 136 and the conductive structures 128, in some embodiments. For ease of illustration and understanding, the dielectric barrier material 136 is not illustrated in FIG. 1C, but it will be understood that the microelectronic device structure 100 may include one or both of the dielectric barrier material 136 and the conductive liner material 138.

The conductive liner material 138, if present, may be formed of and include a seed material from which the conductive structures 128 may be formed. The conductive liner material 138 may be formed of and include, for example, a metal (e.g., titanium, tantalum), a metal nitride (e.g., tungsten nitride, titanium nitride, tantalum nitride), or another material. In some embodiments, the conductive liner material 138 comprises titanium nitride. In other embodiments, the dielectric barrier material 136 is in direct contact with each of the conductive structures 128 and the insulative structure 104 and the microelectronic device structure 100 is substantially (e.g., entirely) devoid of the conductive liner material 138 between the dielectric barrier material 136 and the conductive structures 128. In other words, each of the tiers 130 lack a titanium nitride material between the insulative structure 104 and the conductive structures 128, in some embodiments.

The dielectric barrier material 136 may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride). In some embodiments, the dielectric barrier material 136 comprises aluminum oxide.

With reference to FIG. 1E, after forming the dielectric barrier material 136, the conductive liner material 138, if present, and the conductive structures 128, a portion of the conductive structures 128, the conductive liner material 138, and the dielectric barrier material 136 may be removed from surfaces defining the slots 122 to form recessed portions 140 of the conductive structures 128 and to electrically isolate neighboring conductive structures 128 from one another. In other words, removal of the portions of the conductive structures 128, the conductive liner material 138, and the dielectric barrier material 136 may physically and electrically isolate the conductive structures 128 from each other.

In some embodiments, the conductive liner material 138 and the conductive material of the conductive structures 128 are removed by exposing the conductive liner material 138 and the conductive material of the conductive structures 128 to one or more wet etchants through the slots 122. The wet etchants may include one or more of phosphoric acid, acetic acid, nitric acid, hydrochloric acid, aqua regia, or hydrogen peroxide. However, the disclosure is not so limited and the conductive liner material 138 and the conductive material of the conductive structures 128 may be removed with other etchants and/or material removal processes (e.g., vapor phase removal processes, atomic layer removal processes). In some embodiments, the conductive liner material 138 is removed by exposure to one or more dry etchants, such as one or more chlorine-containing dry etchants. By way of non-limiting example, the one or more dry etchants may include one or more of chlorine gas, boron trichloride (BCL$_3$), oxygen, and argon. In some embodiments, the conductive liner material 138 is removed by exposure to a dry etchant comprising chlorine gas and boron trichloride.

The width of the slots 122 may be tailored based, at least in part, on the grain size of the conductive structures 128 to reduce occurrences of bridging (e.g., electrical connection) between two or more adjacent portions of the conductive structures 128 between neighboring blocks (e.g., between the first block 124 and the second block 126). In some embodiments, the slots 122 are formed to a width that is greater than a width of conventional slots to provide sufficient electrical isolation between the neighboring blocks. Forming the slots 122 may also remove outermost portions of the insulative structure 104, with the remaining amounts of the insulative structure 104 having a width $W_1$ from opposite points of outer sidewalls 144 of the insulative structure 104. Forming the slots 122 results in each of the conductive structures 128 and the conductive liner material 138 being laterally recessed relative to the insulative structure 104, such that outer sidewalls 142 of the conductive structures 128 are nearer to a respective one of the pillars 110 than the outer sidewalls 144 of the insulative structure 104 are to the pillar 110. In other words, the width $W_1$ of the insulative structure 104 is greater than a width $W_2$ of the conductive structures 128, as shown in FIG. 1E. The conductive liner material 138 (if present) may, therefore, extend along only a portion of the width $W_1$ of a neighboring insulative structure 104.

With reference to FIG. 1F, conductive rails 150 may be formed horizontally adjacent (e.g., horizontally on) at least the conductive structures 128. Since forming the slots 122 removes some of the conductive structures 128 and the conductive liner material 138, the electrical resistance exhibited by the conductive structures 128 and the conductive liner material 138 of the tiers 130 of FIG. 1E may be greater than desired. To lower the electrical resistance, the conductive rails 150 may be formed to extend (e.g., laterally extend) from each exposed portion of the conductive structures 128 and, if present, the conductive liner material 138.

The conductive rails 150 may be formed of and include at least one conductive material, such as, for example, one or more of tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RuO$_x$), alloys thereof, a conductively-doped semiconductor material (e.g., conductively doped silicon, conductively doped germanium, conductively doped silicon germanium), polysilicon, and other materials exhibiting electrical conductivity. In some embodiments, the conductive rails 150 are formed of and include tungsten.

The conductive rails 150 may have a material composition that is different than a material composition of the conductive structures 128. For example, the conductive rails 150 may comprise tungsten, while the conductive structures 128 of the initially-formed replacement-gate material may be formed of and include one or more of titanium, ruthenium, aluminum, and molybdenum, as discussed above, while being substantially devoid (e.g., substantially absent) of tungsten. Accordingly, the conductive structures 128 may be substantially devoid (e.g., substantially absent) of the halogen-containing precursors (e.g., fluorine) used in formation of tungsten and the conductive rails 150 may be substantially devoid (e.g., substantially absent) of additional precursors (e.g., chlorine, carbon, oxygen) used in formation of non-tungsten containing materials, such as titanium, ruthenium, aluminum, or molybdenum, for example. In some embodiments, the conductive rails 150 have a greater conductivity than the conductive structures 128.

The conductive rails 150 may be grown, deposited (e.g., by ALD, CVD, pulsed CVD, metal organic CVD). In some embodiments, the conductive rails 150 are formed by deposition of a liner material (e.g., a titanium nitride material), followed by deposition of tungsten to an extent greater than a desired extent of the conductive rails 150. Thereafter, portions of the tungsten material may be removed (e.g., recessed) to form the desired extent (e.g., cross-sectional area) of the conductive rails 150. In other embodiments, the conductive rails 150 are formed by growing tungsten selectively on the conductive structures 128 following the recess of the conductive structures 128. For example, the conductive rails 150 may be formed with a target comprising the material composition of the conductive rails 150. In some such embodiments, the conductive rails 150 may be formed by exposing a target comprising the material composition of the conductive rails 150 with an ionized gas (e.g., argon) to form (e.g., deposit) the conductive rails 150 laterally adjacent the conductive structures 128. In some embodiments, at least some argon may be present within the conductive rails 150.

In some embodiments, the conductive rails 150 may be substantially free of halogens and moisture. In additional embodiments, the conductive rails 150 may include less fluorine and/or less moisture than other conductive materials. For example, in some embodiments, the conductive rails 150 are formed with a target comprising tungsten and are formed without use of fluorine-containing precursors. By way of contrast, conductive structures formed with fluorine-containing precursors, such as tungsten hexafluoride, may include at least some residual fluorine. In addition, the residual fluorine may react with moisture or other materials to form impurities in the conductive structures, reducing the conductivity thereof.

The conductive rails 150 may comprise tungsten exhibiting different properties than a material of the conductive structures 128. For example, the conductive rails 150 may exhibit a different grain size, different electrical properties, and fewer impurities than the conductive structures 128. In some embodiments, the conductive rails 150 comprise tungsten having a larger grain size than a grain size of the material of the conductive structures 128. Since grain size of a material may be based, at least in part, on a thickness (e.g., a height) of the material, the conductive structures 128 may exhibit a grain size within a range of from about 0.1 times to about 10 times the thickness of the conductive structures 128. In some embodiments, the conductive rails 150 exhibit a lower resistivity than the conductive structures 128. The conductive structures 128 may be formed of and include a material that is tailored for reducing (e.g., minimizing) tier voids that may occur during formation of the conductive structures 128 within the tiers 130. Since resistivity of a material may be based, at least in part, on a thickness (e.g., a height) of the material, the conductive structures 128 may exhibit a lower resistivity than the conductive rails 150, in some instances, such as when a thickness of the conductive structures 128 is reduced upon a reduction in pitch of the tiers 130.

In yet other embodiments, the conductive rails 150 are formed by atomic layer deposition. In some such embodiments, the conductive rails 150 are formed with precursors comprising tungsten hexafluoride ($WF_6$) and silane ($SiH_4$) to form the conductive rails 150. Accordingly, in some embodiments, the conductive rails 150 are formed with halogen-containing precursors. In some such embodiments, the conductive rails 150 may include at least some of the halogen (e.g., fluorine).

For example, a precursor material (e.g., a semiconductive liner material) may be formed of and include of at least one semiconductive material, such as one or more of a silicon material, a silicon-germanium material, a boron material, a germanium material, a gallium arsenide material, a gallium nitride material, and an indium phosphide material. By way of non-limiting example, the precursor material may be formed of and include at least one silicon material. As used herein, the term "silicon material" means and includes a material that includes elemental silicon or a compound of silicon. The precursor material may, for example, be formed of and include one or more monocrystalline silicon and polycrystalline silicon. In some embodiments, the precursor material comprises polycrystalline silicon.

The precursor material may be formed to exhibit a desirable dimension (e.g., height, width) based, at least on part, on a desired dimension of the conductive rails 150 and may be formed using one or more conventional conformal deposition processes, such as one or more of a conventional conformal CVD process and a conventional ALD process. In some embodiments, the precursor material is doped (e.g., impregnated) with one or more dopants (e.g., chemical species). The dopant(s) of the doped precursor material may comprise material(s) promoting or facilitating the subsequent formation of tungsten (e.g., β-phase tungsten) from the doped precursor material, as described in further detail below. In some embodiments, the dopant(s) comprise at least one N-type dopant, such as one or more of phosphorus (P), arsenic (Ar), antimony (Sb), and bismuth (Bi). In additional embodiments, the dopant(s) comprise at least one P-type dopant, such as one or more of boron (B), aluminum (Al), and gallium (Ga). In further embodiments, the dopant(s) comprise one or more of carbon (C), fluorine (F), chlorine (Cl), bromine (Br), hydrogen (H), deuterium ($^2H$), helium (He), neon (Ne), and argon (Ar).

The precursor material of the conductive rails 150 may be doped with at least one dopant to form the doped precursor material using conventional processes (e.g., conventional plasma doping (PLAD) implantation processes, conventional diffusion processes), which are not described in detail herein. If employed, the PLAD implantation process may implant the dopant across an entirety of the conductive rails 150. As a non-limiting example, one or more phosphorus-containing species (e.g., phosphorus atoms, phosphorus-containing molecules, phosphide ions, phosphorus-containing ions) may be implanted into the precursor material to form the doped precursor material. The phosphorus-containing species may, for example, comprise phosphide ions ($P^{3-}$). As another non-limiting example, one or more arsenic-containing species (e.g., arsenic atoms, arsenic-containing molecules, arsenic ions, arsenic-containing ions) may be implanted into the precursor material to form the doped precursor material. The arsenic-containing species may, for example, comprise arsenic ions ($As^{3+}$). In some embodiments, following dopant implantation, an amount of dopant within the doped precursor material is within a range of from about 0.001 atomic percent to about 10 atomic percent. The individual portions of the doped precursor material of the conductive rails 150 may individually exhibit a substantially homogeneous distribution of dopant(s) within the semiconductive material thereof, or may individually exhibit a heterogeneous distribution of dopant(s) within the semiconductive material thereof.

Thereafter, portions of the doped precursor material may be converted into the conductive rails 150 including tungsten and the dopant(s) of the doped precursor material. The conversion process may convert portions of the semiconductive material (e.g., silicon material, such as polycrystalline silicon) of the doped precursor material including dopant(s) dispersed therein into tungsten relatively faster than an undoped semiconductive material.

At least some of the tungsten of the conductive rails 150 may comprise β-phase tungsten. β-phase tungsten has a metastable, A15 cubic structure. Grains of the β-phase tungsten may exhibit generally columnar shapes. Tungsten included within the conductive rails 150 may only be present in the β-phase, or may be present in the β-phase and in the alpha (α) phase. If present, the α-phase tungsten has a metastable, body-centered cubic structure. Grains of the α-phase tungsten may exhibit generally isometric shapes. If the conductive rails 150 include β-phase tungsten and α-phase tungsten, an amount of β-phase tungsten included in the conductive rails 150 may be different than an amount of α-phase tungsten included in the conductive rails 150, or may be substantially the same as amount of α-phase tungsten included in the conductive rails 150. In some embodiments, an amount of β-phase tungsten included in the conductive rails 150 is greater than an amount of α-phase tungsten included in the conductive rails 150. For example, at least a majority (e.g., greater than 50 percent, such as greater than or equal to about 60 percent, greater than or equal to about 70 percent, greater than or equal to about 80 percent, greater than or equal to about 90 percent, greater than or equal to about 95 percent, or greater than or equal to about 99 percent) of the tungsten included in the conductive rails 150 may be present in the β-phase.

The dopant(s) included in the conductive rails 150 may be substantially the same as the dopant(s) included in the doped precursor material employed to form the conductive rails 150. For example, dopant(s) (e.g., N-type dopants, P-type dopants, other dopants) used to form the conductive rails 150 may be present in the conductive rails 150 following formation thereof. In some embodiments, the conductive rails 150 include β-phase tungsten doped with one or more of As and P. The dopant(s) of the conductive rails 150 may support (e.g., facilitate, promote) the stability of the β-phase tungsten of the conductive rails 150.

The conductive rails 150 may exhibit a substantially homogeneous distribution of the dopant(s) thereof, or may exhibit a heterogeneous distribution of the dopant(s) thereof. The distribution of the dopant(s) within the conductive rails 150 may be substantially the same as or may be different than a distribution of the dopant(s) within the doped precursor material.

The conductive rails 150 may be formed by treating the doped precursor material with one or more chemical species facilitating the conversion of the semiconductive material (e.g., silicon material) thereof into tungsten (e.g., β-phase tungsten, α-phase tungsten). By way of non-limiting example, if the doped precursor material comprises a doped silicon material, such as doped polycrystalline silicon, the doped precursor material may be treated with tungsten hexafluoride ($WF_6$) to form the conductive rails 150. Silicon (Si) of the doped precursor material may react with the $WF_6$ to produce tungsten (W) and silicon tetrafluoride ($SiF_4$). The produced $SiF_4$ is removed as a gas. The produced W remains with the dopant(s) of the doped precursor material to form the conductive rails 150. The doped precursor material may, for example, be treated with $WF_6$ using a conventional CVD apparatus at a temperature within a range of from about 200° C. to about 500° C.

The conductive rails 150 may be formed (e.g., deposited, grown) adjacent (e.g., on, directly on) the outer sidewalls 142 of the conductive structures 128 (and, if present, the conductive liner material 138) remaining after formation of the slots 122 of FIG. 1E. In some embodiments, the conductive structures 128 function as a seed material for the growth of the conductive rails 150, as discussed above. In some embodiments, a phase (e.g., β-phase, α-phase) of the conductive rails 150 may depend, at least in part, on an phase (e.g., β-phase, α-phase) of the material of the conductive structures 128 in embodiments that include, for example, the precursor material of the conductive rails 150 being grown directly on the conductive structures 128.

The formation (e.g., deposition, growth) may be continued or repeated at least until the conductive rails 150 extend laterally beyond the outer sidewalls 144 of the insulative structure 104. In embodiments in which the conductive liner material 138 is present, the conductive rails 150 also extends laterally beyond sidewalls (e.g., side ends) of the conductive liner material 138. Formation (e.g., deposition, growth) of the conductive rails 150 may be tailored to form as much of the conductive rails 150 as desired to lower the electrical resistance exhibited by the conductive structures 128 without allowing electrical shorting between vertically neighboring conductive structures 128.

In some embodiments, such as that of FIG. 1F, the conductive rails 150 are formed (e.g., deposited, grown) until each laterally extends beyond and, in some instances, vertically overlaps the outer sidewalls 144 of the insulative structure 104, while still providing electrical isolation between neighboring blocks (e.g., the first block 124, the second block 126). In other embodiments, the conductive rails 150 are formed until each laterally extends beyond the outer sidewalls 144 of the insulative structure 104 without vertically overlapping the outer sidewalls 144. In other words, a lower surface 148 and an upper surface 152 may be substantially coplanar with lower and upper surfaces of the conductive structures 128 and/or the conductive liner material 138 without being adjacent the outer sidewalls 144 of the insulative structure 104. Accordingly, the conductive rails 150 exhibit a height equal to or greater than a height of the conductive structures 128 of the stack structure 101.

With the conductive rails 150 extending laterally beyond the insulative structure 104, a maximum width $W_3$ defined by outer sidewalls 146 of the conductive rails 150 is greater than a maximum width $W_1$ defined by the outer sidewalls 144 of the insulative structures 104 and, thus, greater than a maximum width $W_2$ defined by the outer sidewalls 142 of the conductive structures 128. As used herein, the "outer" sidewalls 142, 144, 146 are the sidewalls proximate the sidewalls of a respective one of the blocks (e.g., the first block 124, the second block 126), opposite sidewalls proximate the pillars 110. Accordingly, the conductive rails 150 extend from the respective conductive structure 128, away from the pillars 110, such that the stack structure 101 includes conductive tiers of the tiers 130 including the conductive rails 150 that are laterally wider than the insulative structure 104. In some embodiments, the width $W_2$ of the conductive structures 128 may be substantially similar to (e.g., substantially the same as) a width between outer side surfaces of outermost ones of the pillars 110. In other words, the conductive structures 128 may extend within regions of the stack structure 101 that are laterally bordered by the pillars 110, without extending beyond the outermost pillars 110 on each lateral end of the blocks (e.g., the first block 124, the second block 126). In other embodiments, at least a portion of the conductive structures 128 intervene between the pillars 110 and the conductive rails 150, such that the pillars 110 are not in direct physical contact with the conductive rails 150.

By way of non-limiting example, the width $W_3$ of the conductive tiers may exceed the width $W_2$ of the conductive structures 128 by a range of from about 5 nm to about 100 nm, such as from about 5 nm to about 10 nm, from about 10 nm to about 20 nm, from about 20 nm to about 50 nm, or from about 50 nm to about 100 nm. Accordingly, each of the conductive rails 150 may have a horizontal width within a range of from about 5 nm to about 100 nm, such as from about 5 nm to about 10 nm, from about 10 nm to about 20 nm, from about 20 nm to about 50 nm, or from about 50 nm to about 100 nm. Further, the width $W_3$ of the conductive tiers may exceed the width $W_1$ of the insulative structure 104 by a range of from about 2 nm to about 50 nm, such as from about 2 nm to about 5 nm, from about 5 nm to about 10 nm, from about 10 nm to about 20 nm, or from about 20 nm to about 50 nm.

Individual conductive rails 150 are separated (e.g., spaced) from neighboring conductive rails 150 (e.g., the conductive rails 150 above and/or below) by a separation distance $D_1$ that is sufficient to electrically isolate each conductive rail 150 coupled to each conductive structure 128 of an individual tier 130 from each other conductive rail 150 coupled to each conductive structure 128 of another individual tier 130 vertically neighboring the individual tier 130. The separation distance $D_1$ is defined by the dimension separating the lower surface 148 of one of the conductive rails 150 from the upper surface 152 of a neighboring one of the conductive rails 150. In some embodiments, the separation distance $D_1$ between each vertically neighboring pair of the conductive rails 150 is substantially equal (e.g., substantially uniform) along the stack structure 101. In other embodiments, the separation distance $D_1$ varies at different elevations of the stack structure 101, provided each neighboring pair of the conductive rails 150 is electrically isolated from one another. By way of non-limiting example, the distance $D_1$ between the neighboring pairs of the conductive rails 150 may be within a range of from about 2 nm to about 20 nm, such as from about 2 nm to about 5 nm, from about 5 nm to about 10 nm, from about 10 nm to about 15 nm, or from about 15 nm to about 20 nm.

In some embodiments, a height $H_2$ (defined as a vertical dimension between the lowest elevation of the lower surface 148 and the highest elevation of the upper surface 152) of an individual conductive rail 150 is substantially the same as a height $H_1$ (e.g., defined as a vertical dimension between the lowest elevation of a lower surface 154 and the highest elevation of an upper surface 156) an individual conductive structure 128. In other words, the lower surface 148 of the conductive rail 150 may be substantially coplanar with the lower surface 154 of the conductive structure 128, while the upper surface 152 of the conductive rail 150 may be substantially coplanar with the upper surface 156 of the conductive structure 128, as discussed above. In other embodiments, the height $H_2$ of the conductive rail 150 is relatively greater than the height $H_1$ of the conductive structure 128, as shown in FIG. 1F. As used herein, the "non-rail remainder" of an individual tier 130 means that portion of the tier 130 that is outside of the boundaries of the conductive rail(s) 150 coupled to the conductive structure(s) 128 of the tier 130. The non-rail remainder of an individual tier 130 includes the conductive structure 128 and, if present, the conductive liner material 138. The lower surface 154 and the upper surface 156 of the non-rail remainder of the individual tier 130 may be defined by the conductive structure 128, in the tiers 130 consisting of the conductive structures 128, or by the conductive liner material 138, in the tiers 130 comprising both the conductive structures 128 and the conductive liner material 138, as in the microelectronic device structure 100 of FIG. 1F, as well as in other embodiments of the disclosure.

By way of non-limiting example, the height $H_1$ of an individual conductive structure 128 may be within a range of from about 10 nm to about 50 nm, such as from about 10 nm to about 20 nm, from about 20 nm to about 30 nm, from about 30 nm to about 40 nm, or from about 40 nm to about 50 nm. If present, the conductive liner material 138 may have a thickness (e.g., a height) within a range of from about 0.5 nm to about 5 nm; and the dielectric barrier material 136, if present, may have a similar thickness as that of the conductive liner material 138. Further, the height $H_2$ of the conductive rails 150 may be within a range of from about 20 nm to about 100 nm, such as from about 20 nm to about 30 nm, from about 30 nm to about 40 nm, from about 40 nm to about 50 nm, or from about 50 nm to about 100 nm. The height $H_2$ of an individual conductive rail 150 may, for example, be within a range of from about 1 percent to about 250 percent (e.g., from about 10 percent to about 250 percent, from about 25 percent to about 125 percent, from about 50 percent to about 100 percent) larger than the height $H_1$ of an individual conductive structure 128.

With returned reference to FIG. 1F, additional portions of the insulative structures 104 may be removed (e.g., etched) adjacent the outer sidewalls 144 (e.g., at opposing outer corners) of the insulative structures 104 prior to forming the conductive rails 150. Accordingly, notches 158 (e.g., cut-outs) may be formed in the corners of the insulative structures 104 by removing portions of the insulative structures 104 extending beyond the outer sidewalls 142 of the conductive structures 128, without removing portions of the insulative structures 104 along vertical centerlines thereof. In other words, the notches 158 form recessed portions extending into the insulative structure 104 at the opposing outer corners thereof to facilitate formation of individual conductive rails 150 exhibiting a substantially rectangular cross-sectional shapes (e.g., substantially square cross-sectional shapes), with the lower surfaces 148 and the upper surfaces 152 thereof being substantially planar.

While the lower surfaces 148 and the upper surfaces 152 of the conductive rails 150 may be substantially planar, as shown in the embodiment of FIG. 1F, at least some of the lower surfaces 148 and the upper surfaces 152 of the conductive rails 150 may be otherwise structured but still include a greater height $H_2$ relative to the height $H_1$ of the conductive structures 128. For example, formation of the conductive rails 150 may result in a tapered (e.g., non-planar) surface along at least some of the lower surfaces 148 and the upper surfaces 152 thereof, such the conductive rails 150 forms at least one concave-shaped region proximate the notches 158. Alternatively, or additionally, formation of the conductive rails 150 may result in the outer sidewalls 146 thereof being formed in a vertically-convex shape, such that the conductive rails 150 forms a mushroom-shaped conductive rails 150. The concave-shaped portions and/or the vertically-convex shape of the outer sidewalls 146 may be the natural result of the formation (e.g., deposition, growth) process acts conducted to form the conductive rails 150.

Referring now to FIG. 1G, remaining (e.g., unfilled) portions of the slots 122 (FIG. 1F) may be filled with a fill material 160. The fill material 160 may extend through the stack structure 101 and be adjacent to (e.g., directly on) exposed upper surfaces of the source structure 108. In addition, the fill material 160 may be located between neighboring blocks (e.g., the first block 124 and the second block 126) at locations corresponding to the slots 122.

The fill material 160 may be formed of and include at least one insulative material. In some embodiments, the fill material 160 has substantially the same material composition as the insulative structures 104. The fill material 160 may be substantially homogeneous, or may be heterogeneous, as discussed in greater detail with reference to FIG. 1J. As used herein, the term "homogeneous" means amounts of a material do not vary (e.g., change) throughout different portions (e.g., different horizontal portions, different vertical portions) of another material or structure. Conversely, as used herein, the term "heterogeneous" means amounts of a material vary throughout different portions of another material or structure.

One of ordinary skill in the art will appreciate that, in accordance with additional embodiments of the disclosure, the features and feature configurations described above in relation to FIGS. 1A through 1G may be adapted to design needs of different microelectronic devices (e.g., different memory devices). By way of non-limiting example, in accordance with additional embodiments of the disclosure, FIGS. 1H and 1I show simplified, partial cross-sectional views of a method of forming a microelectronic device structure having a different configuration than the microelectronic device structure 100. Throughout the remaining description and the accompanying figures, functionally similar features (e.g., structures, devices) are referred to with similar reference numerals. To avoid repetition, not all features shown in the remaining figures (including FIGS. 1H and 1I) are described in detail herein. Rather, unless described otherwise below, a feature designated by a reference numeral of a previously described feature (whether the previously described feature is first described before the present paragraph, or is first described after the present paragraph) will be understood to be substantially similar to the previously described feature.

FIG. 1H illustrates a simplified partial cross-sectional view of a microelectronic device structure 100'. At the processing stage depicted in FIG. 1H the microelectronic device structure 100' may be substantially similar to the microelectronic device structure 100 at the processing stage depicted in FIG. 1F. In addition, the processing stage depicted in FIG. 1I of the microelectronic device structure 100' may be substantially similar to the microelectronic device structure 100 at the processing stage depicted in FIG. 1G. Further, FIG. 1J illustrates an enlarged portion of box J of FIG. 1I, in accordance with the embodiment of the microelectronic device structure 100' of FIG. 1I, and applying equally to the embodiment of the microelectronic device structure 100 of FIG. 1G.

With returned reference to FIG. 1H, the conductive rails 150 of the microelectronic device structure 100' may be formed adjacent (e.g., on, directly on) at least the conductive structures 128, as in the previous embodiment of the microelectronic device structure 100. The conductive rails 150 may be formed to extend (e.g., laterally extend) from each exposed portion of the conductive structures 128 and, if present, the conductive liner material 138. The conductive rails 150 may have a material composition that is different than a material composition of the conductive structures 128. For example, the conductive structures 128 may comprise a material including one or more of titanium, ruthenium, aluminum, and molybdenum and the conductive rails 150 comprise tungsten.

The conductive rails 150 may be grown, deposited (e.g., by ALD, CVD, pulsed CVD, metal organic CVD) on the outer sidewalls 142 of the conductive structures 128. The formation (e.g., deposition, growth) may be continued or repeated at least until the conductive rails 150 extend laterally beyond the outer sidewalls 144 of the insulative structures 104, as in the previous embodiment of FIG. 1F. However, the conductive rails 150 may be formed adjacent the upper and lower surfaces of the insulative structures 104, without the notches 158 (FIG. 1F) being formed in the opposing outer corners of the insulative structures 104 prior to forming the conductive rails 150. In other words, the portions of the insulative structures 104 between the pillar 110 and the conductive rails 150 may exhibit a substantially rectangular cross-sectional shape (e.g., a substantially square cross-sectional shape) with the outer sidewalls 142 as well as the upper surface and the lower surfaces thereof being substantially planar. Accordingly, the conductive rails 150 define a "T" shape extending away from the outer sidewalls 142 of the conductive structures 128 and adjacent the opposing outer corners of the insulative structure 104, such that the conductive rails 150 are characterized herein as "T-shaped" conductive rails.

The conductive rails 150 include a first portion 150a located laterally beyond the outer sidewall 144 of the insulative structures 104, that defines the height $H_3$ (defined as the dimension between a lowest elevation of the lower surface 148 and a highest elevation of the upper surface 152), which, in this embodiment, is greater than the height $H_1$ of the conductive structures 128 of the non-rail remainder of the individual tiers 130. The conductive rails 150 include a second portion 150b located vertically between the insulative structure 104 that has a height substantially equal to the height $H_1$ of the conductive structures 128, including the conductive liner material 138, if present, of the non-rail remainder of the individual tiers 130. Accordingly, the conductive rails 150, being T-shaped, extend between vertically neighboring portions of the insulative structure 104, and the first portion 150a may partially surround (e.g., laterally surround) a portion of the insulative structure 104. The conductive rails 150 each define a lesser height at an inner portion, proximate the pillars 110, than at outer portions, distal from the pillars 110.

By way of non-limiting example, the height $H_1$ of an individual conductive structure 128 may be within a range of from about 10 nm to about 50 nm, such as from about 10 nm to about 20 nm, from about 20 nm to about 30 nm, from about 30 nm to about 40 nm, or from about 40 nm to about 50 nm. If present, the conductive liner material 138 may have a thickness (e.g., a height) within a range of from about 0.5 nm to about 5 nm, and the dielectric barrier material 136, if present, may have a similar thickness as that of the conductive liner material 138. Further, the height $H_3$ of an individual conductive rail 150 may be within a range of from about 20 nm to about 100 nm, such as from about 20 nm to about 30 nm, from about 30 nm to about 40 nm, from about 40 nm to about 50 nm, or from about 50 nm to about 100 nm. The height $H_3$ of an individual conductive rail 150 may, for example, be within a range of from about 1 percent to about 500 percent (e.g., from about 10 percent to about 250 percent, from about 25 percent to about 125 percent, from about 50 percent to about 100 percent) larger than the height $H_1$ of an individual conductive structure 128.

Opposing lower and upper surfaces 148, 152 of neighboring conductive rails 150 are separated (e.g., spaced) by separation distance $D_2$ sufficient to provide adequate electrical isolation therebetween. The separation distance $D_2$ may be tailored to the minimum distance that achieves electrical isolation, while providing the greatest amount of conductive material contributed by the conductive rails 150 to the overall amount of conductive material (including the conductive structures 128 and conductive liner material 138) within individual tiers 130. By way of non-limiting example, the distance $D_2$ between the neighboring pairs of the conductive rails 150 may be within a range of from about 2 nm to about 20 nm, such as from about 2 nm to about 5 nm, from about 5 nm to about 10 nm, from about 10 nm to about 15 nm, or from about 15 nm to about 20 nm.

With reference to FIG. 1I, remaining portions of the slots 122 (FIG. 1H) may be filled with the fill material 160. The fill material 160 may extend through the stack structure 101 and be adjacent to (e.g., directly on) exposed upper surfaces of the source structure 108. In addition, the fill material 160 may be located between neighboring blocks (e.g., the first block 124 and the second block 126) at locations corresponding to the slots 122.

The fill material 160 may be formed of and include at least one insulative material. In some embodiments, the fill material 160 has substantially the same material composition as the insulative structures 104. The fill material 160 may be substantially homogeneous, or may be heterogeneous. FIG. 1J illustrates an enlarged portion of box J of FIG. 1I and illustrates a heterogeneous configuration of the fill material 160, wherein the fill material 160 include three different materials in a stacked arrangement with one another, in accordance with embodiments of the disclosure. With reference to FIG. 1J, the fill material 160 may include one or more insulative (e.g., dielectric) materials, such as a nitride material 162 (e.g., a silicon nitride), an oxide material 164 (e.g., a silicon oxide (e.g., silicon dioxide)), and polysilicon 166.

The fill material 160 may be formed in the slots 122 (FIGS. 1F, 1H), such as by forming (e.g., conformally forming) the nitride material 162 adjacent the outer sidewalls 146 of the conductive rails 150 and adjacent the outer sidewalls 144 of the insulative structures 104, forming (e.g., conformally forming) the oxide material 164 adjacent the nitride material 162, and forming (e.g., conformally forming) the polysilicon 166 adjacent the oxide material 164. Once the fill material 160 is formed, the outer sidewalls 144 of the insulative structures 104 and the outer sidewalls 146 of the conductive rails 150 are adjacent the fill material 160. In embodiments including the nitride material 162, the oxide material 164, and the polysilicon 166 of the fill material 160, the outer sidewalls 144 of the insulative structures 104 and the outer sidewalls 146 of the conductive rails 150 are in direct contact with an outermost material (e.g., the nitride material 162) of the fill material 160, as shown in FIG. 1J. The nitride material 162 of the fill material 160 may also be in direct contact with at least some of the lower surfaces 148 (FIG. 1H) and the upper surfaces 152 (FIG. 1H) of the conductive rails 150. In some embodiments, the fill material 160 includes one or more air gaps. The air gaps may be located at the narrowest spaces between neighboring conductive rails (e.g., the conductive rails 150) and may further promote electrical isolation between neighboring conductive rails 150. For clarity and ease of understanding the drawings and associated description, the fill material(s) 160 (e.g., the nitride material 162, the oxide material 164, and the polysilicon 166) are described and illustrated with reference to the microelectronic device structure 100' of FIGS. 1I and 1J. However, the disclosure of the fill material(s) 160 (e.g., the nitride material 162, the oxide material 164, and the polysilicon 166) applies equally to the embodiment of the microelectronic device structure 100, as discussed above with reference to FIG. 1G.

With returned reference to FIG. 1J, formation of the conductive rails 150 may comprise selectively forming (e.g., depositing, growing) the conductive rails 150 on the conductive structures 128 (and, optionally, if present, the conductive liner material 138). That is, the conductive rails 150 may be formed in a manner that forms the conductive rails 150 on at least the conductive structures 128 without forming the conductive rails 150 on the insulative structure 104 at all (according to some embodiments) or in such a minimal amount that conductive rails 150 formed on the insulative structure 104 can be removed (e.g., etched) without entirely removing the conductive rails 150 formed on the conductive structures 128.

In some embodiments, the selective formation of the conductive rails 150 may be facilitated or accommodated by pretreating the stack structure 101 (FIGS. 1G, 1I) prior to forming the conductive rails 150 and, thus, prior to forming the fill material 160. In some such embodiments, and as that illustrated in FIG. 1J, surfaces of the insulative structure 104 exposed within the slots 122 (FIGS. 1F, 1H) may be treated to inhibit formation of the conductive rails 150 thereon. For example, an inhibiting material 168 may be formed (e.g., continuously formed, discontinuously formed) to be absorbed within at least some portions of the insulative structure 104. The inhibiting material 168 may be formulated to be selectively formable on the insulative structure 104 and to inhibit formation (e.g., deposition, growth (e.g., nucleation)) of the conductive rails 150 on the inhibiting material 168. The inhibiting material 168 may be formed of and include, but not limited to, an organic inhibitor (e.g., a polymer), which may be selectively formed on the insulative structure 104 (e.g., a silicon dioxide). The inhibiting material 168 may be formulated to inhibit deposition, growth, adsorption, or absorption of the conductive rails 150 during formation of the conductive rails 150 on the conductive structures 128 (and, if present, the conductive liner material 138). Accordingly, the microelectronic device structures 100, 100' may also include the inhibiting material 168 on the outer sidewalls 144 of the insulative structure 104, between the insulative structure 104 and the fill material(s) 160 (e.g., the nitride material 162).

In other embodiments utilizing a pretreatment before forming (e.g., depositing, growing) the conductive rails 150, surfaces of the conductive structures 128 and (if present) the conductive liner material 138 exposed within the slots 122 (FIGS. 1F, 1H) may be treated to promote formation of the conductive rails 150 thereon. For example, with reference to FIG. 1J, a formation-promoter 170 may be formed (e.g., deposited) on the outer sidewalls 142 of the conductive structures 128 (and, if present, the conductive liner material 138). The formation-promoter 170 may comprise, consist essentially of, or consist of boron (B) or silicon (Si). In other embodiments, the formation-promoter 170 may be a pristine surface of the conductive structures 128 (and, if present, the conductive liner material 138), resulting from, e.g., a wet clean or a dry clean process to which the outer sidewall 142 was exposed.

The formation-promoter 170 may be formulated such that the conductive rails 150 form at a faster rate on the formation-promoter 170 than on the insulative structure 104, during formation of the conductive rails 150 on the conductive structures 128 (and, if present, the conductive liner material 138). Accordingly, the microelectronic device structures 100, 100' may also include the formation-promoter 170 between the conductive rails 150 and the conductive structures 128 (and, if present, the conductive liner material 138).

In other embodiments, the conductive rails 150, the conductive structures 128, and the insulative structure 104 may be formulated such that the conductive rails 150 selectively forms (e.g., grows, deposits) on the conductive structures 128 without a pre-treatment (e.g., inhibiting material formation, promoter formation) prior to forming the conductive rails 150.

In yet other embodiments, the conductive rails 150 may be selectively formed on the conductive structures 128 via cycling through formation and removal (e.g., etching) stages. During the formation stages, the conductive rails 150 may be formed on all surfaces exposed in the slots 122 (FIGS. 1F, 1H), but at a greater formation rate on the conductive structures 128 than on the insulative structure 104. Therefore, a greater amount of the conductive rails 150 may form on the conductive structures 128 than a lesser amount that forms on the insulative structure 104. Between each formation stage, a removal (e.g., etching) stage may be conducted to remove some of the conductive rails 150 at a consistent rate. Accordingly, the lesser amount of the conductive rails 150 that had formed on the insulative structure 104 may be removed while leaving at least some of the greater amount of the conductive rails 150 that had formed on the conductive structures 128. Repeating these formation and removal stages in a cycle may permit the conductive rails 150 to build up (e.g., deposit, grow) on the conductive structures 128 without forming a lasting amount of the conductive rails 150 on the insulative structure 104. For clarity and ease of understanding the drawings and associated description, the inhibiting material 168 and the formation-promoter 170 are described and illustrated with reference to the microelectronic device structure 100' of FIGS. 1I and 1J. However, the disclosure of the inhibiting material 168 and the formation-promoter 170 applies equally to the embodiment of the microelectronic device structure 100, as discussed above with reference to FIG. 1G.

As described above, forming the stack structure 101 of the microelectronic device structures 100, 100' to include the conductive structures 128 formed of a first material composition (e.g., titanium, ruthenium, aluminum, and molybdenum) and the conductive rails 150 formed of a second, different material composition (e.g., tungsten) may facilitate improved performance of the microelectronic device structures 100, 100'.

For example, the presence of the conductive rails 150 laterally adjacent the conductive structures 128 effectively increases the amount of conductive material present in the conductive tiers of the tiers 130, compared to conductive tiers lacking the conductive rails, without necessitating an increase in the horizontal footprint of the tiers 130 or the blocks (e.g., the first block 124, the second block 126). The increased amount of conductive material (e.g., the conductive structures 128 in combination with the conductive rails 150) may provide a reduced resistivity (e.g., electrical resistance levels) of the conductive material in each respective tier 130. In some embodiments, the electrical resistance exhibited by the conductive material may be from about 1% to about 50%, or even a higher percentage, less than the electrical resistance of conductive material of a conventional conductive tier of a 3D NAND structure. For example, where a conventional conductive tier may exhibit an electrical resistance of about 13 Ω·μm, the conductive tiers of the structures of the embodiments of the disclosure may exhibit an electrical resistance of about 5 Ω·μm. The lower electrical resistance may be achieved without necessitating an increase to the pitch or critical dimension (CD) of the pillars 110. Accordingly, reduced resistivity may be achieved, even while the pitch or CD of the pillars 110 continue to be scaled down to smaller values and while thicknesses (e.g., a height in the Z-direction) of the conductive tiers of the tiers 130 continue to be reduced.

In addition, since the conductive rails 150 having a second, different material composition are formed laterally adjacent the conductive structures 128 having a first material composition, the conductive rails 150 may exhibit a lower resistivity relative to the conductive structures 128. Since the conductive structures 128 may be formed of and include a material composition that is tailored for reducing (e.g., minimizing) tier voids within the conductive tiers of the tiers 130, the conductive structures 128 may be selected for improved properties in forming (e.g., depositing, growing) such materials and the conductive rails 150 may be selected for improved properties (e.g., reduced resistivity) during use and operation of the microelectronic device structures 100, 100'. Since resistivity of a material may be based, at least in part, on thicknesses of the material, presence of the conductive structures 128 may provide a reduced thickness of the conductive tiers of the tiers 130 without substantially reducing conductivity by providing a lower resistivity material within the conductive rails 150. Further, the conductive structures 128 may not include halides, such as fluorine, which may be present in conductive structures formed with halide-containing precursors. The reduced resistivity of the conductive materials of the tiers 130 may improve performance of the strings 132 of memory cells 134.

Microelectronic device structures formed according to embodiments described herein may exhibit improved performance by providing reduced occurrences of tier voids during formation of the conductive materials (e.g., the conductive structures 128) within the tiers 130. Further, reduced resistivity and, thus, increased conductivity may be achieved by providing additional conductive materials (e.g., the conductive rails 150) that extend beyond a boundary of the insulative structures 104 to provide an increased cross-sectional area of conductive material within the individual tiers 130. Additional performance improvements may be achieved by the conductive structures 128 comprising a first material composition and the conductive rails 150 comprising a second, different material composition, which configuration may exhibit improved performance compared to conventional microelectronic device structures. By way of comparison, fabrication of conventional microelectronic device structures may include fabrication of conductive tiers having a single material composition, as well as a decreased cross-sectional area of conductive material within individual tiers.

Thus, in accordance with some embodiments of the disclosure, a microelectronic device comprises a stack structure comprising alternating conductive structures and insulative structures arranged in tiers, each of the tiers individually comprising a conductive structure and an insulative structure, strings of memory cells vertically extending through the stack structure, the strings of memory cells comprising a channel material vertically extending through the stack structure, and conductive rails laterally adjacent to the conductive structures of the stack structure. The conductive rails comprise a material composition that is different than a material composition of the conductive structures of the stack structure.

Moreover, in accordance with further embodiments of the disclosure, a method of forming a microelectronic device comprises forming a stack structure comprising vertically alternating conductive structures and insulative structures, forming memory strings comprising a channel material and at least one dielectric material vertically extending through the stack structure, and forming conductive rails along outer sidewalls of the conductive structures of the stack structure. The conductive rails comprise a material composition that is different than a material composition of the conductive structures of the stack structure.

Figure 2:
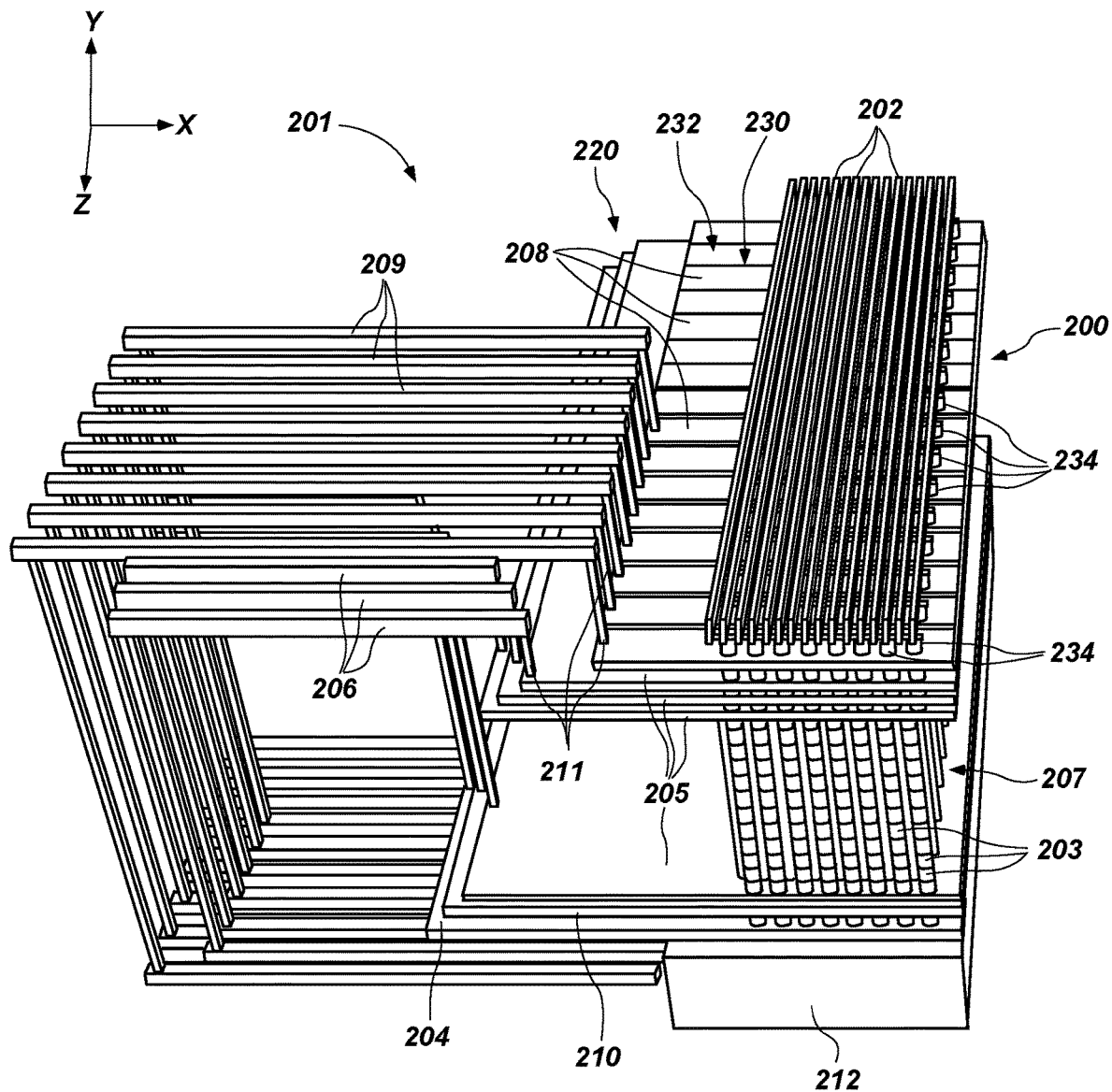
FIG. 2 is a partial cutaway perspective view of a microelectronic device, in accordance with embodiments of the disclosure.

FIG. 2 illustrates a partial cutaway perspective view of a portion of a microelectronic device 201 (e.g., a memory device, such as a dual deck 3D NAND Flash memory device) including a microelectronic device structure 200. The microelectronic device structure 200 may be substantially similar to one of the microelectronic device structures 100, 100' previously described with reference to FIG. 1A through FIG. 1J. As shown in FIG. 2, the microelectronic device structure 200 may include a staircase structure 220 defining contact regions for connecting access lines 206 to conductive structures 205 (e.g., corresponding to the conductive structures 128 (FIG. 1C)). The microelectronic device structure 200 may include vertical strings 207 (e.g., strings 132 (FIG. 1C)) of memory cells 203 (e.g., corresponding to the memory cells 134 (FIG. 1C)) that are coupled to each other in series. The vertical strings 207 may extend vertically (e.g., in the Z-direction) and orthogonally to conductive lines and the conductive structures 205, such as data lines 202, a source tier 204 (e.g., including the source structure 108 (FIG. 1C)), the access lines 206, first select gates 208 (e.g., upper select gates, drain select gates (SGDs), select lines 209, and a second select gate 210 (e.g., a lower select gate, a source select gate (SGS)). The select gates 208 may be horizontally divided (e.g., in the Y-direction) into multiple blocks 232 (e.g., blocks 124, 126 (FIG. 1C)) horizontally separated (e.g., in the Y-direction) from one another by slots 230 (e.g., the fill material 160 (FIG. 1G, FIG. 1I) formed within the replacement gate slots 122 (FIG. 1E)).

Vertical conductive contacts 211 may electrically couple components to each other as shown. For example, the select lines 209 may be electrically coupled to the first select gates 208 and the access lines 206 may be electrically coupled to the conductive structures 205. The microelectronic device 201 may also include a control unit 212 positioned under the memory array, which may include at least one of string driver circuitry, pass gates, circuitry for selecting gates, circuitry for selecting conductive lines (e.g., the data lines 202, the access lines 206), circuitry for amplifying signals, and circuitry for sensing signals. The control unit 212 may be electrically coupled to the data lines 202, the source tier 204, the access lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., digit lines, bit lines) may extend horizontally in a second direction (e.g., in the Y-direction) that is at an angle (e.g., perpendicular) to the first direction in which the first select gates 208 extend. Individual data lines 202 may be coupled to individual groups of the vertical strings 207 extending the second direction (e.g., the Y-direction) at the first end (e.g., the upper end) of the vertical strings 207 of the individual groups. Additional individual group of the vertical strings 207 extending the first direction (e.g., the X-direction) and coupled to individual first select gates 208 may share a particular vertical string 207 thereof with individual group of vertical strings 207 coupled to an individual data line 202. Thus, an individual vertical string 207 of memory cells 203 may be selected at an intersection of an individual first select gate 208 and an individual data line 202. Accordingly, the first select gates 208 may be used for selecting memory cells 203 of the vertical strings 207 of memory cells 203.

The conductive structures 205 (e.g., word line plates) may extend in respective horizontal planes. The conductive structures 205 may be stacked vertically, such that each conductive structure 205 is coupled to at least some of the vertical strings 207 of memory cells 203, and the vertical strings 207 of the memory cells 203 extend vertically through the stack structure including the conductive structures 205. The conductive structures 205 may be coupled to or may form control gates of the memory cells 203.

The first select gates 208 and the second select gates 210 may operate to select a vertical string 207 of the memory cells 203 interposed between data lines 202 and the source tier 204. Thus, an individual memory cell 203 may be selected and electrically coupled to a data line 202 by operation of (e.g., by selecting) the appropriate first select gate 208, second select gate 210, and conductive structure 205 that are coupled to the particular memory cell 203.

The staircase structure 220 may be configured to provide electrical connection between the access lines 206 and the conductive structures 205 through the vertical conductive contacts 211. In other words, an individual conductive structure 205 may be selected via an access line 206 in electrical communication with a respective vertical conductive contact 211 in electrical communication with the conductive structure 205.

The data lines 202 may be electrically coupled to the vertical strings 207 through conductive contact structures 234 (e.g., contact structures formed over the pillars 110 (FIG. 1C)).

Thus, in accordance with additional embodiments of the disclosure, a memory device comprises a stack structure comprising tiers of alternating conductive structures and insulative structures, pillars vertically extending through the stack structure, each pillar comprising a channel structure comprising a semiconductive material vertically extending through the stack structure, and conductive rails vertically extending along sidewalls of the conductive structures and the insulative structures of the stack structure. The conductive rails have greater electrical conductivity than the conductive structures.

Figure 3:
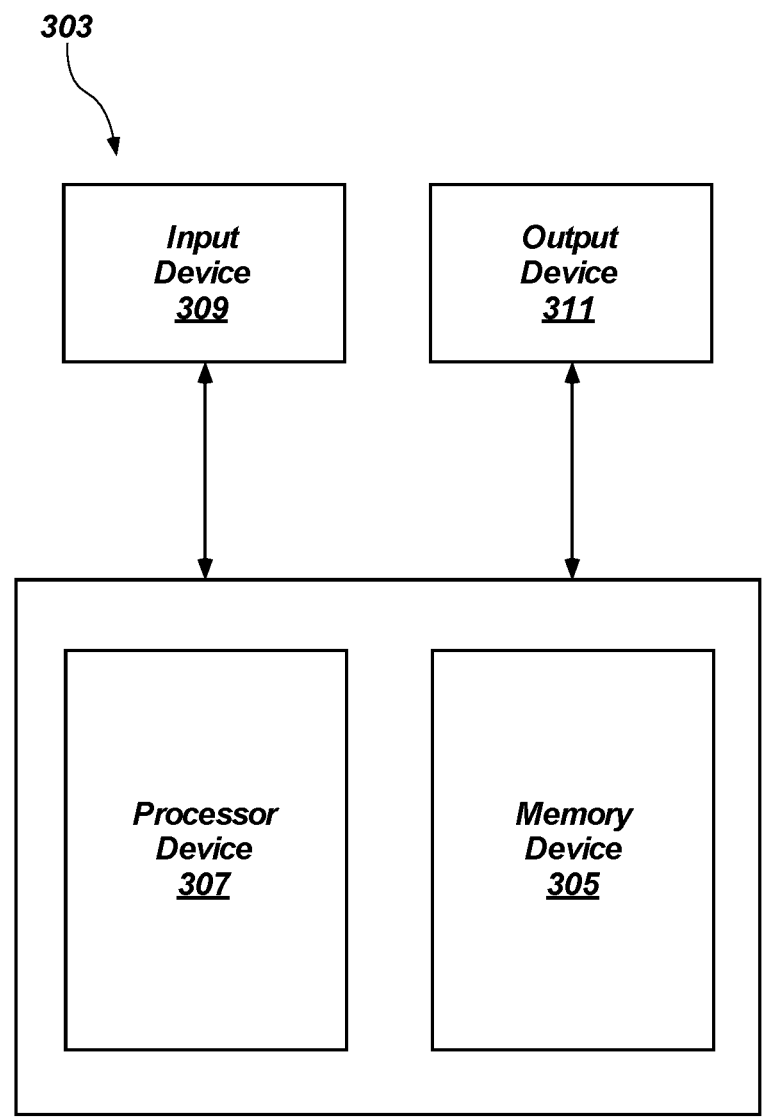
FIG. 3 is a block diagram of an electronic system, in accordance with embodiments of the disclosure.

Microelectronic devices including microelectronic devices (e.g., the microelectronic device 201) and microelectronic device structures (e.g., the microelectronic device structures 100, 100', 200) including the conductive rails 150 comprising a material composition that is different than a material composition of the conductive structures 128, according embodiments of the disclosure may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a microelectronic device structure previously described herein (e.g., the microelectronic device structures 100, 100', 200) or a microelectronic device (e.g., the microelectronic device 201) previously described with reference to FIG. 1A through FIG. 1J and FIG. 2) including the conductive structures 128 and the conductive rails 150.

The electronic system 303 may further include at least one electronic signal processor device 307 (often referred to as a "microprocessor"). The electronic signal processor device 307 may, optionally, include an embodiment of a microelectronic device or a microelectronic device structure previously described herein (e.g., one or more of the microelectronic device 201 or the microelectronic device structures 100, 100', 200 previously described with reference to FIG. 1A through FIG. 1J and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
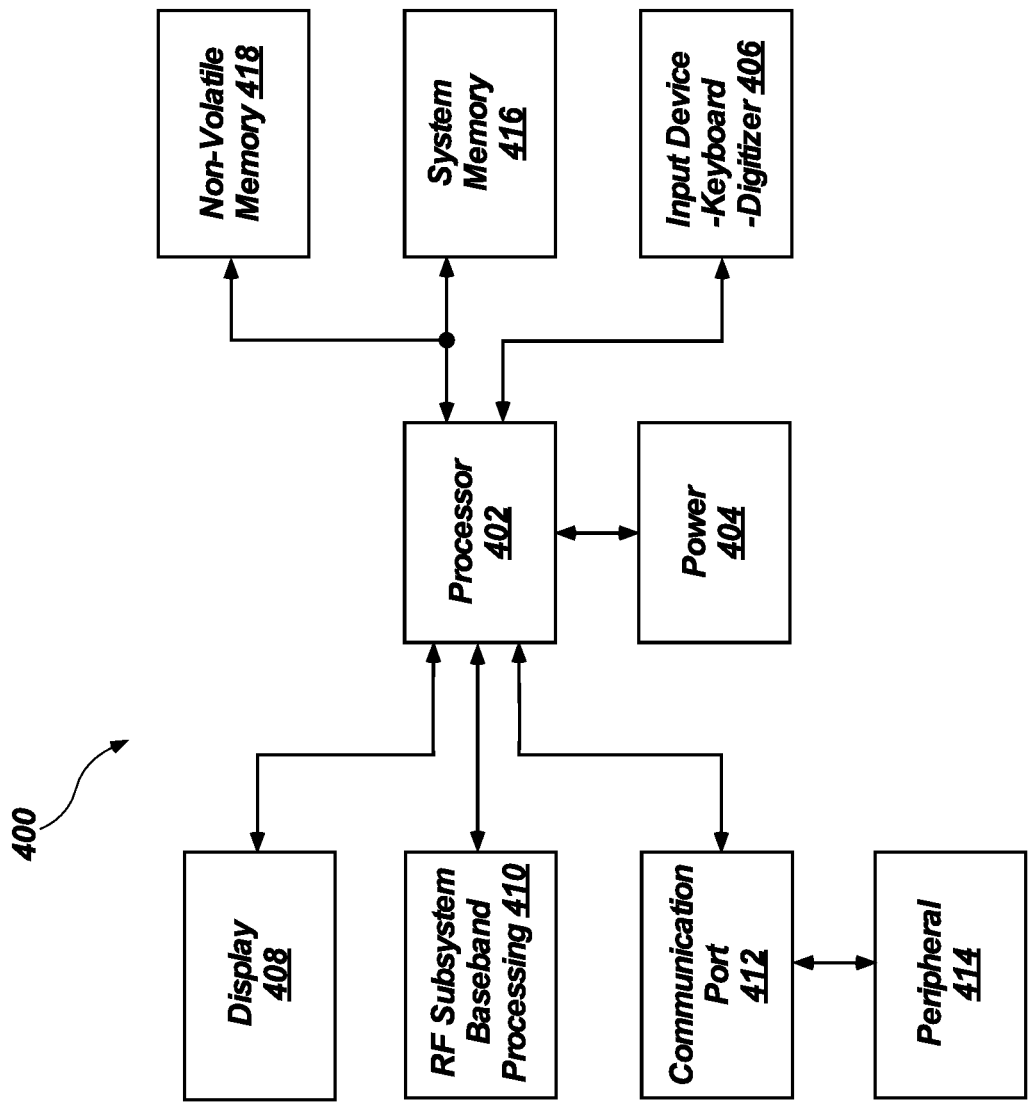
FIG. 4 is a block diagram of a processor-based system, in accordance with embodiments of the disclosure.

With reference to FIG. 4, depicted is a processor-based system 400. The processor-based system 400 may include various microelectronic devices and microelectronic device structures (e.g., microelectronic devices and microelectronic device structures including one or more of the microelectronic device 201 or the microelectronic device structures 100, 100', 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include microelectronic devices and microelectronic device structures (e.g., microelectronic devices and microelectronic device structures including one or more of the microelectronic device 201 or the microelectronic device structures 100, 100', 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the microelectronic devices and microelectronic device structures (e.g., the microelectronic device 201 and the microelectronic device structures 100, 100', 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as the microelectronic devices and microelectronic device structures (e.g., the microelectronic device 201 and the microelectronic device structures 100, 100', 200) described above, or a combination thereof.

Accordingly, in at least some embodiments, an electronic device comprises an input device, an output device, a processor device operably coupled to the input device and the output device, and a memory device operably coupled to the processor device and comprising at least one microelectronic device. The at least one microelectronic device comprises strings of memory cells vertically extending through a stack structure comprising vertically alternating sequences of insulative structures and conductive structures substantially devoid of tungsten arranged in tiers, and additional conductive structures horizontally neighboring the conductive structures of the stack structure and comprising beta phase tungsten. Vertical heights of the additional conductive structures are greater than vertical heights of the conductive structures of the stack structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a stack structure comprising alternating conductive structures and insulative structures arranged in tiers, each of the tiers individually comprising a conductive structure and an insulative structure;
   strings of memory cells vertically extending through the stack structure, the strings of memory cells comprising a channel material vertically extending through the stack structure;
   a replacement gate slot comprising dielectric material between neighboring blocks of the stack structure; and
   conductive rails within the replacement gate slot, the conductive rails laterally adjacent to and directly physically contacting outer sidewalls of the conductive structures of the stack structure, portions of the conductive structures intervening between the strings of memory cells and the conductive rails most proximate thereto, the conductive rails comprising a T-shaped rail of a conductive material, a first portion of the T-shaped rail located laterally beyond an outer sidewall of the insulative structure and a second portion of the T-shaped rail located vertically between neighboring insulative structures, the second portion having a height substantially equal to a height of the conductive structure, and the conductive rails comprising a material composition that is different than a material composition of the conductive structures of the stack structure.

2. The microelectronic device of claim 1, wherein the conductive rails horizontally extend past horizontal boundaries of the insulative structures.

3. The microelectronic device of claim 1, wherein the conductive rails have greater electrical conductivity than the conductive structures.

4. The microelectronic device of claim 1, wherein:
   the conductive rails further comprise one or more of phosphorus, arsenic, antimony, bismuth, boron, aluminum, gallium, carbon, fluorine, chlorine, bromine, and argon; and
   the conductive structures of the stack structure are substantially devoid of fluorine.

5. The microelectronic device of claim 1, further comprising a conductive liner material between the insulative structure and the conductive structure, wherein the conductive rails comprise tungsten and the conductive liner material comprises titanium nitride.

6. The microelectronic device of claim 1, further comprising a dielectric barrier material between and in direct contact with the insulative structure and the conductive structure.

7. The microelectronic device of claim 1, wherein the dielectric material substantially fills remaining portions of the replacement gate slot extending through the stack structure, wherein a lateral dimension of the dielectric material laterally adjacent to the insulative structures is greater than a lateral dimension of the dielectric material laterally adjacent to the conductive rails.

8. The microelectronic device of claim 1, wherein:
   the conductive rails comprise beta phase tungsten; and
   the conductive structures are substantially devoid of tungsten.

9. The microelectronic device of claim 1, wherein upper surfaces of the second portion of the T-shaped rail are substantially coplanar with upper surfaces of the conductive structures, and lower surfaces of the second portion of the T-shaped rail are substantially coplanar with lower surfaces of the conductive structures.

10. The microelectronic device of claim 1, wherein the conductive rails separate portions of vertically neighboring insulative structures from one another, the conductive rails laterally extending beyond sidewalls of the insulative structures.

11. The microelectronic device of claim 1, wherein the conductive rails are adjacent to two consecutive sides of the insulative structures.

12. A microelectronic device, comprising:
    a stack structure comprising tiers of alternating conductive structures and insulative structures;
    strings of memory cells comprising a channel material vertically extending through the stack structure;
    dielectric-filled slots between neighboring strings of memory cells; and
    conductive rails within the dielectric-filled slots, the conductive rails laterally adjacent to and directly physically contacting the conductive structures of the stack structure along outer sidewalls, opposite sidewalls of the conductive structures proximate the strings of memory cells, the conductive rails comprising tungsten and the conductive structures comprising titanium, ruthenium, aluminum, or molybdenum, and the conductive rails comprising T-shaped rails, portions of the T-shaped rails located laterally beyond outer sidewalls of the insulative structures and additional portions of the T-shaped rails located vertically between neighboring insulative structures, the additional portions individually having a height substantially equal to a height of the conductive structures.

13. The microelectronic device of claim 12, wherein the dielectric-filled slots are defined between two internal sidewalls of the stack structure, and the conductive structures proximal to the dielectric-filled slots are laterally recessed relative to the insulative structures.

14. The microelectronic device of claim 13, wherein the additional portions of the T-shaped rails are within recessed regions of the conductive structures, and the portions of the T-shaped rails are laterally adjacent to sidewalls of the insulative structures.

15. The microelectronic device of claim 12, wherein the conductive rails are separated from the strings of memory cells most proximate thereto by portions of the conductive structures.

16. The microelectronic device of claim 12, wherein the portions of the T-shaped rails each individually exhibit a height greater than a height of each of the conductive structures of the stack structure.

* * * * *

UNITED STATES PATENT AND TRADEMARK OFFICE
CERTIFICATE OF CORRECTION

PATENT NO. : 11,715,692 B2
APPLICATION NO. : 16/990580
DATED : August 1, 2023
INVENTOR(S) : John D. Hopkins et al.

It is certified that error appears in the above-identified patent and that said Letters Patent is hereby corrected as shown below:

In the Specification

Column 7, Line 5, change "comprises Sift. In" to --comprises $SiO_2$. In--

Signed and Sealed this
Sixteenth Day of July, 2024

*Katherine Kelly Vidal*
*Director of the United States Patent and Trademark Office*